United States Patent [19]
Brennan, Jr. et al.

[11] Patent Number: 5,959,883
[45] Date of Patent: Sep. 28, 1999

[54] RECORDING AND PLAYBACK INTEGRATED SYSTEM FOR ANALOG NON-VOLATILE FLASH MEMORY

[75] Inventors: James Brennan, Jr., Saratoga; Anthony Dunne, Cupertino; Peter Holzmann; Geoff Jackson, both of Campbell; Albert Kordesch, San Jose; Chun-Mai Liu, San Jose; Kung-Yen Su, San Jose; Hieu Van Tran, San Jose, all of Calif.

[73] Assignee: Information Storage Devices, Inc., San Jose, Calif.

[21] Appl. No.: 09/004,798

[22] Filed: Jan. 9, 1998

[51] Int. Cl.[6] .................................................. G11C 11/34
[52] U.S. Cl. ................................ 365/185.03; 365/189.12; 365/45
[58] Field of Search ......................... 365/185.03, 189.12, 365/45, 233, 189.07

[56] References Cited

U.S. PATENT DOCUMENTS

| | | |
|---|---|---|
| 4,890,259 | 12/1989 | Simko . |
| 4,989,179 | 1/1991 | Simko . |
| 5,126,967 | 6/1992 | Simko . |
| 5,220,531 | 6/1993 | Blyth et al. . |
| 5,241,494 | 8/1993 | Blyth et al. . |
| 5,388,064 | 2/1995 | Khan . |
| 5,623,436 | 4/1997 | Sowards et al. ............... 365/45 |
| 5,629,890 | 5/1997 | Engh . |
| 5,642,316 | 6/1997 | Tran et al. . |
| 5,664,060 | 9/1997 | Jarrett et al. . |
| 5,726,934 | 3/1998 | Tran et al. . |

OTHER PUBLICATIONS

"SST Data Book", Silicon Storage Technology, Inc., pp. 17.1–17.7 (May 1995).

*Primary Examiner*—David Nelms
*Assistant Examiner*—Van Thu Nguyen
*Attorney, Agent, or Firm*—Blakely, Sokoloff, Taylor & Zafman LLP

[57] ABSTRACT

An analog recording and playback system using non-volatile flash memory. An array of flash memory cells is used to store an analog signal and retrieve the stored analog signal on a real-time basis. A plurality of column driver circuits are coupled to the columns of flash memory cells for simultaneous programming and reading. A programming algorithm is used to write the analog signal within an operating range of the flash memory cells since the operating range may shift due to process variations. The system includes trimbit circuits to provide a trimmable initial programming voltage, programming step, programming current, read current, and select gate voltage. The system further includes a Serial Peripheral Interface ("SPI") that interfaces with a host microcontroller. The host microcontroller can send a number of commands to the system through the SPI for efficient message management. These commands include the basic commands to record or playback and various addressing and message cueing options. The system utilizes row and column redundancy to increase production yield.

26 Claims, 17 Drawing Sheets

ERASE:

PROGRAM:

READ:

RECORDING AND PLAYBACK INTEGRATED SYSTEM FOR ANALOG NON-VOLATILE FLASH MEMORY

BACKGROUND OF THE INVENTION

1. Field of the Invention

The present invention relates generally to the field of integrated circuit design, and specifically, to a non-volatile memory integrated circuit for storing and retrieving analog signals.

2. Background Information

Conventional integrated circuit systems that store analog signals (e.g., a voice signal) includes an analog to digital converter ("ADC") to convert an input analog signal to digital bits, typically in binary format, that represents the input analog input signal. The digital bits are then stored in a digital memory such as a Dynamic Random Access Memory ("DRAM"), Static Random Access Memory ("SRAM"), or non-volatile FLASH memory. The retrieval of the analog signal is done by first reading the digital bits stored in the digital memory and then converting them to the analog signal by way of an digital to analog converter ("DAC"). One main disadvantage of using this approach is the need for DACs and ADCs. A bigger disadvantage, however, is the use of a digital memory which can only store two distinct levels of information, i.e., a "0" and a "1".

One solution used to overcome the disadvantages discussed above is described in U.S. Pat. No. 5,241,494 issued to Blyth et al. or in co-pending U.S. patent application Ser. No. 08/819,665, entitled "Analog Signal Recording and Playback Integrated Circuit and Message Management System" by Hieu Van Tran et al., both of which are assigned to the assignee of the present invention. Both the '494 patent and the patent application have the advantage of not needing DAC or ADC as the input analog signal is stored directly on EEPROM ("electrically erasable programmable read only memory") cells. That is, each EEPROM cell is capable of storing a signal that has a resolution of one part in 250 or better. As such, each memory cell can store, for example, 8 times more information. This yields a much lower cost per system.

The analog recording and playback integrated system of the present invention uses FLASH memory cells that results in an even lower cost than the two systems discusses above. This is due to a much smaller FLASH memory cell size as compared to that of an EEPROM cell. The present invention further includes specific techniques required for the flash technology as applied to analog recording and playback integrated systems. Moreover, an improved serial peripheral interface ("SPI") as compared to that described in co-pending U.S. patent application Ser. No. 08/819,665, is explained. An algorithm and circuit implementation for programming of the flash memory cells is described in detail. Complementary cells and a differential sensing circuit are used for detection of end of message ("EOM") markers to reduce the effects of threshold drift over time and temperature range.

SUMMARY OF THE INVENTION

In one embodiment, the present invention includes an array architecture of analog flash memory cells, a trimmable programming algorithm for use in programming to and reading from the flash memory cells, an improved serial peripheral interface ("SPI"), a differential end of message ("EOM") marker sensing circuit, and a column program/read/compare/inhibit circuit.

BRIEF DESCRIPTION OF THE DRAWINGS

The features and advantages of the present invention will become apparent from the following detailed description of the present invention in which.

DESCRIPTION OF THE PREFERRED EMBODIMENT

Figure 1:
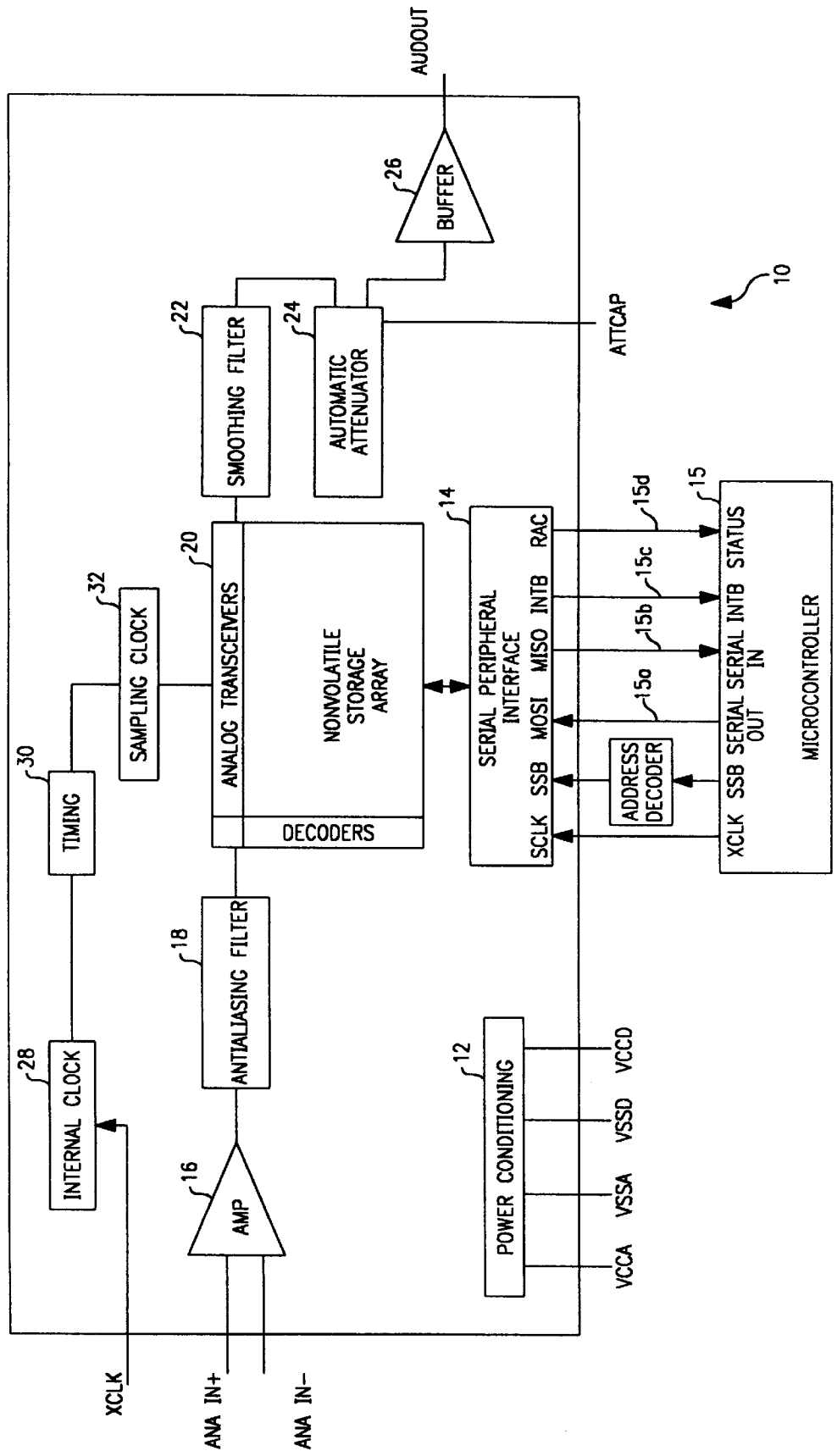
FIG. 1 is a block diagram illustrating an analog recording and playback system of the present invention.

FIG. 1 is a block diagram illustrating an analog recording and playback system 10 of the present invention. In the preferred embodiment, the system 10 is implemented in a single integrated circuit package. Referring to FIG. 1, the system 10 integrates all major circuits of a message management system. The system 10 includes four major sections, i.e., the analog input and output paths, the analog storage array, the serial peripheral interface, and the automatic attenuator assembly. Power is supplied to the analog section and to the array and digital section from separate VCC and VSS supply pins. In that regard, care is taken to minimize noise coupling between the analog and digital sections, not only from the power supplies, but also from the other signals, by way of the block diagram level design, circuit design, physical layout and pin outs, and board level designs utilizing the device.

In particular, to minimize noise, the analog and digital circuits in the integrated circuit 10 of the present invention utilize separate power busses. The voltage inputs VCCA and VCCD which supply the analog and digital circuits respectively, are brought out to separate pins. In a preferred embodiment, the voltage inputs VCCA and VCCD are +3 volts. The ground inputs VSSA and VSSD to the analog and digital circuits respectively, are connected through a lowimpedance path to power supply ground. The voltage inputs VCCA and VCCD and the ground inputs VSSA and VSSD are connected to a power conditioning circuit 12, which supplies regulated power to the circuits within the integrated circuit 10.

A Serial Peripheral Interface ("SPI") 14 is provided for the control and addressing functions of the integrated circuit 10. The integrated circuit 10 is configured to operate as a peripheral slave device, with a microcontroller-based SPI 14 which interfaces to a microcontroller 15. Read/Write access to all the internal circuits of the integrated circuit 10 is provided through the SPI 14. An interrupt signal line (INTB) and a status line (RAC) are provided for handshake purposes.

Figure 2A:
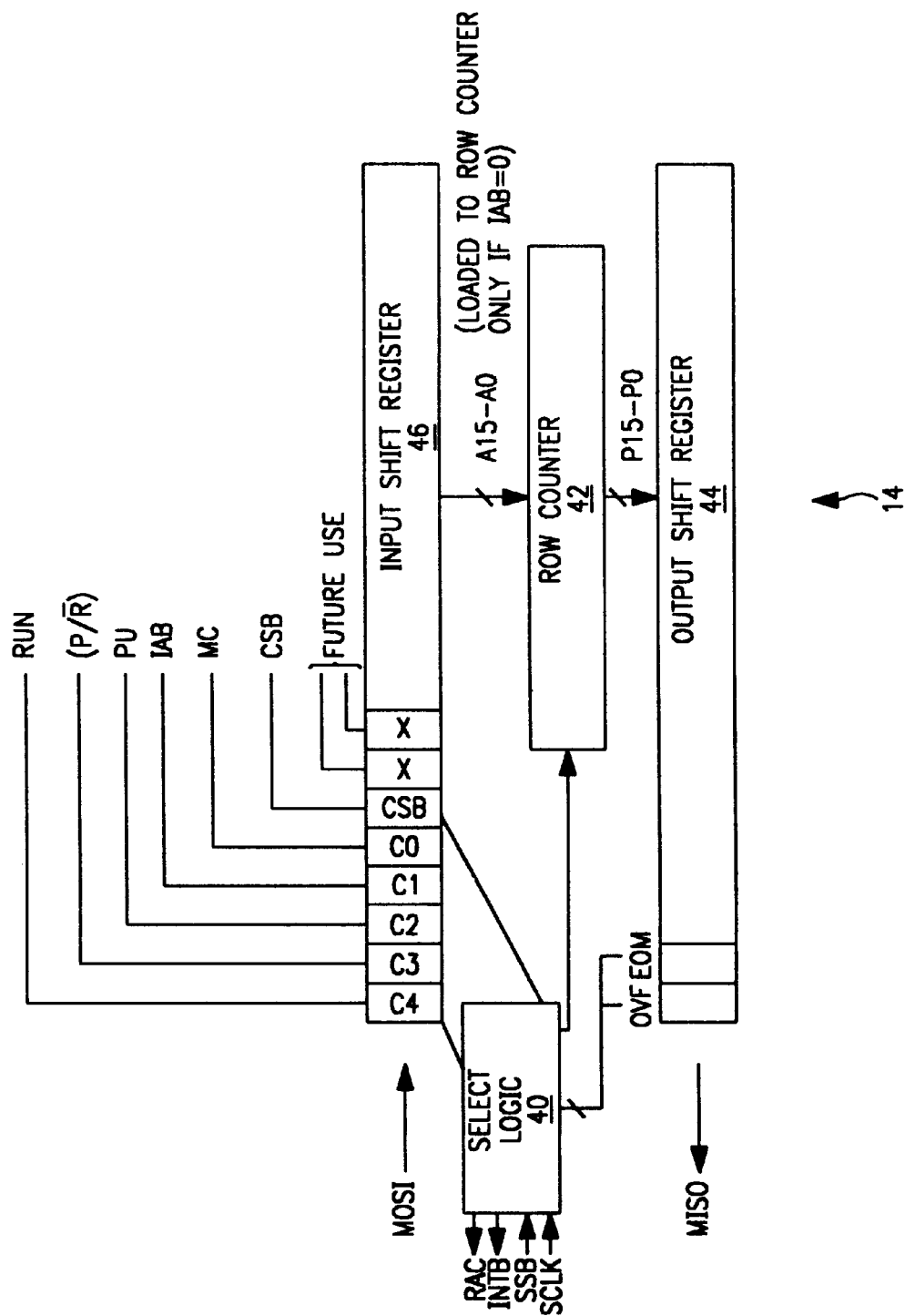
FIG. 2A illustrates the serial peripheral interface ("SPI") of the present invention.
Figure 2B:
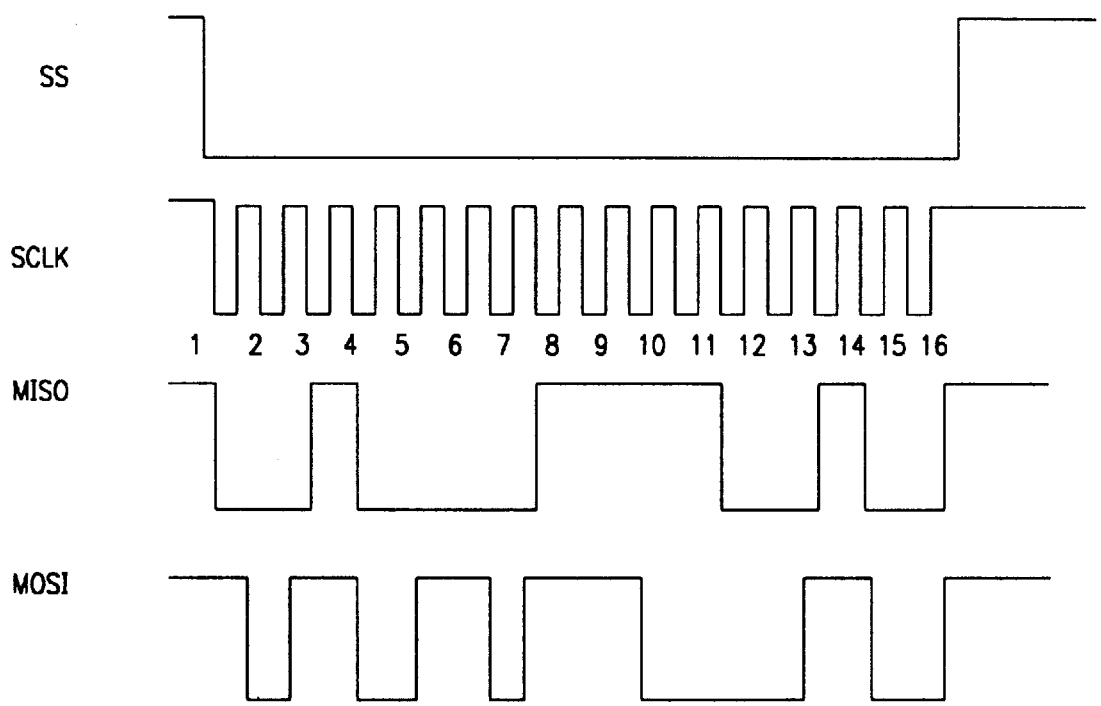
FIG. 2B is an exemplary timing diagram illustrating the timing of various signals received or generated by the SPI.

In particular, the SCLK, SSB, Master Out Slave In ("MOSI"), and Master In Slave Out ("MISO") pins on the SPI 14 are used for synchronous serial communications (FIG. 2B shows a timing diagram of the signals on these pins). The external microcontroller 15 uses these four pins to communicate and to check the status of the integrated circuit 10. The SCLK terminal is the clock input to the device. It is generated by the master device (microcontroller) and is used to synchronize data transfers in and out of the device through the MOSI and MISO terminals, respectively. Data is latched into the integrated circuit 10 on the rising edge of SCLK and shifted out of the circuit 10 on the falling edge of SCLK. The SSB input, when LOW, selects or activates the SPI 14. In this embodiment, the SPI 14 is selected when the slave select signal (SSB) received at the SSB terminal, is LOW. Alternatively, the SPI 14 may be permanently selected by tying the SSB pin to a ground voltage. The MOSI pin is a serial input to the SPI 14. The master device (microcontroller 15) places data on the MOSI line one-half cycle before the SCLK clock edge. The MISO terminal is the serial output of the integrated circuit 10. This output goes into a high-impedance state if the integrated circuit 10 is not selected.

The INTB pin is an open-drain output pin which is activated (drops low to "0") when the system reaches an end of message ("EOM") marker in play or when the memory array is full. Each operation that ends in an EOM or overflow will generate an interrupt which indicates the end of a Record, Playback, or Message Cueing cycle. The interrupt is cleared the next time an SPI cycle is initiated.

The RAC ("Row Address Clock") terminal is an open drain output pin that provides a signal with a 200 ms period at 8 KHz sampling frequency. This represents a single row of memory, and there are 1200 rows of memory in the device 10. The signal remains HIGH for 175 ms and stays LOW for 25 ms when it reaches the end of a row. This pin may be used for implementation of message management techniques.

Speech or analog signals are provided to the integrated circuit 10 via the ANA IN+ pin for recording directly on the memory cells in the array. This pin is the non-inverting analog input for the device. The analog input amplifier 16 can be driven single-endedly or differentially. In the single-ended input mode, a 32 $mV_{p-p}$ maximum signal is capacitively connected to the ANA IN+ pin. In the differential input mode, the maximum input signal at the ANA IN+ pin should be 16 $mV_{p-p}$. The ANA IN– pin is the inverting analog input terminal that transfers the signal to be recorded to the amplifier 16 in the differential-input mode. In this differential-input mode, a 16 $mV_{p-p}$ maximum input signal may be capacitively coupled to the ANA IN– pin.

The output of the amplifier 16 is provided to an anti-aliasing filter 18, the function of which is to limit the upper frequency of the audio (or other analog) signal so that the signal frequency range does not violate the sampling theorem for the analog signal sampling. The filtered signal is stored in a nonvolatile analog storage array 20. When the stored signal is retrieved from the memory array, it is first provided to a smoothing filter 22 and then to an automatic attenuator 24. The automatic attenuator 24 may be located before the filter 22 without affecting the circuit operation.

The automatic attenuator 24 is controlled by the pin ATTCAP. The automatic attenuator 24 attenuates the signal when the signal drops below an internally set threshold. This helps in eliminating output noise when there is no signal. The output of the automatic attenuator is buffered by buffer 26. Buffer 26 is a typical analog MOS buffer. The output of the buffer 26 is AUDOUT.

Timing for the integrated circuit 10 is provided either by an external clock via the External Clock (XCLK) terminal or by an internal oscillator. Either clock signal provides timing reference for the timing circuit 30, which in turn provides timing control for the sampling clock 32 connected to the nonvolatile analog storage array 20.

One aspect of the present invention includes a high speed read scheme which provides monitoring of the exact output voltage of a memory array at a very high speed. Instead of reading cell by cell serially by multiplexing the shift registers, a group of cells, for example 200 cells, are read in parallel in the source follower mode, the resulting analog output voltages are then compared to a fixed input reference voltage, the comparator digital outputs are then latched into the latches at the same time. A fast serial shift is executed to shift out all the logic signals, instead of analog signals, into a digital output pad, bypassing the output analog path. The speed is limited by the shift register and the output digital pad for every 200 cells. By reusing existing circuits, no additional penalty in die size is encountered.

The following discussion assumes an analog non-volatile memory application. In the preferred embodiment, each analog non-volatile memory cell has a resolution on the order of one part in 250 or better in order to adequately record analog waveforms. For instance, in an audio application that provides 240 seconds of storage, the required array size is determined by the quotient of 240 seconds divided by one over the audio sampling rate (e.g., 8 KHz), i.e., (240 seconds/125 $\mu$s) or 1.92 million memory cells. That is, each cell stores 125 $\mu$s of an audio waveform. In the preferred embodiment, the memory array 20 is organized as 1600 columns by 1200 rows, although other variations are possible.

The memory array 20 can be accessed by row addresses only. Each row is divided into 8 scans, each scan is equal to 200 cells or equivalent to 25 ms of audio storage. Twenty-five milliseconds is chosen to be the audio resolution. An EOM digital memory cell is used to store the mark of an audio resolution. The EOM cells are written at the end of the recording of each message. An entire row can be programmed or read back in 8 scans. Two hundred column drivers are used to drive 200 cells at one time. An 8:1 MUX is used with each column driver to connect the 200 column drivers to the 1600 columns.

In the normal reading, a shift register, which is part of the column driver, is used as a cyclic binary shifter to enable the provision of one memory output at a time, along the column drivers, beginning from the first column to the 200th column. At the end of the 200th cell (or column), the column MUX goes to the next 200 columns, and the process repeats eight times to cover the entire row. After the end of one row, the row clock advances to the next row, and the column MUX is reset to enable the first 200 columns. The process then repeats for the next row. The memory output is the actual voltage level that is read from the memory cell, and is not necessarily a logical one or zero.

The memory array 20 includes rows and columns of flash memory cells that allows for a much smaller die size and hence lower cost. The architecture and algorithm for this flash technology is described in association with FIGS. 3A, 3B, 4A, 4B, 5, 5A, 5B, and 5C. The column driver circuit and the column MUX circuit used to accomplish the needed operating condition is described in association with FIGS. 6 and 6A, respectively. Complementary cells and differential sensing for EOM markers are described in association with FIGS. 7A and 7B. Moreover, the system 10 also uses a reference system, row redundancy, column redundancy, fuses for providing trimmable bits, and a trimbit circuit. These aspects will be discussed in the following paragraphs.

FIG. 2A illustrates the SPI 14. The SPI includes select logic 40, a row counter 42, an input shift register 44 and an output shift register 46. All serial data transfers begin with the falling edge of the signal on the SSB pin. The SSB signal is held LOW during all serial communications and held HIGH between instructions. FIG. 2B is an exemplary timing diagram illustrating the timing of various signals received or generated by the SPI 14. In this example, the SSB input is held LOW for 16 serial clock (SCLK) periods. During this time, the MISO data is serially read out from the device and the MOSI data is serially written into the device.

The input shift register 44 is coupled to the MOSI pin and receives serial inputs from the master device such as the microcontroller 15 (see FIG. 1). The microcontroller 15 may be any microprocessor including a general-purpose microprocessor, an embedded controller, a single-chip microcontroller, or a complete microprocessor system.

In the preferred embodiment, the command format is three bytes long and includes bits A15–A0, C4–C0, CSB, and two reserved bits. Bits A15–A0 are the address of the row decoder, C4–C0 are control bits, and CSB is a configuration set bit for future use with a multi-duration part. Control bit C4 is the (RUN) control bit, C3 is the play/record control bit (P/$\overline{R}$), C2 is the power up control bit (PU), C1 is the Ignore Address control Bit (IAB), and C0 is used for message cueing (MC). Table 1 shows the operation summary of the command interface bits.

TABLE 1

| Instruction | Control bit | Operational Summary |
| --- | --- | --- |
| RUN (C4) | | Enable or Disable an operation |
| = | 1 | Start |
| = | 0 | Stop |
| P/$\overline{R}$ (C3) | | Selects Play or Record Operation |
| = | 1 | Play |
| = | 0 | Record |
| PU (C2) | | Master power control |
| = | 1 | Power-Up |
| = | 0 | Power-Down |
| IAB (C1) | | Ignore address control bit |
| = | 1 | Ignore input address register (A15–A0) |
| = | 0 | Use the input address register contents for an operation (A15–A0) |
| MC (C0) | | Message Cueing |
| = | 1 | Enable message cueing |
| = | 0 | Disable message cueing |
| A15–A0 | | Input address register |

Message cueing is started at a specified address with the IAB bit set or at the current address without the IAB bit set. When the message cueing bit C0 is set, the user can skip through messages without knowing the actual physical location of the message. This operation is used during playback. In this mode, the messages are skipped many times faster than in normal playback mode. In a preferred embodiment, the messages are skipped 1600 times faster than in normal playback mode. Playback terminates when an EOM marker is reached. Then, the internal address counter will point to the next message. A summary of the instructions sent by the microcontroller 15 to the SPI 14, along with the corresponding operations, is provided in Table 2.

TABLE 2

| Instruction | Control bits C4–C0 | Operational Summary |
| --- | --- | --- |
| POWER UP | 00100 | Power Up. Device will be ready for an operation after time out period. |
| SETREC | 10100 | Initiate recording. Must be followed by REC command. Record after time out period starting at the address A15–A0. |
| STOPPWRDN | 0x01x | Stop an operation and Power Down. |
| STOP | 0x110 | Stop Record or Playback Operation. |
| SETPLAY | 11100 | Playback at an address after Power Up. Initiate playing. Must be followed by PLAY command. |
| REC | 10110 | Start Record at the next available address. |
| SETMC | 11101 | Initiate Playback and Message Cueing (MC) at the address specified by A15–A0. Must be followed by MC command. |
| MC† | 11111 | Initiate a Playback and Message Cueing at the next available address. |
| PLAY | 11110 | Play at the next available address (ignore address bits). |
| RINT†† | 0x110 | Read Interrupt status bits: Overflow and EOM. |

†Message cueing can be selected only at the beginning of play operation.
††As the Interrupt data is shifted out of the integrated circuit 10, control and address data is being shifted in. The interrupt command should be compatible to the current command if there is no change to the device operation.

With reference to FIG. 2A, the control bits C4–C0 are provided from the input shift register 46 to the select logic 40. Upon latching the control data from the input shift register 44, the select logic 40 generates control signals that are distributed internally to various other system blocks and also to control the power-down, record/play select, message cueing mode and the IAB. The select logic 40 receives additional inputs from internal signals such as low VCC detect (LOVCC) and Power on Reset (POR).

An internally generated clock signal is used to synchronize these inputs and to prevent the control circuit from entering a metastable state which locks up the integrated circuit 10. In one embodiment, a power-up time of 25 ms is provided to allow all the bias generators and capacitors to reach their quiescent point. The row counter 42 receives address inputs A15–A0 from the input shift register 44 and provides these as pointer outputs to output shift register 46.

The interrupt signal (INTB) and the status bits (EOM and Overflow (OVF)) are generated by the select logic 40. The interrupt signal is cleared after the status has been read by the microcontroller 15. The internal operation of the integrated circuit 10 does not depend on the time at which the interrupt was cleared. By way of example, when the integrated circuit 10 is in the play mode and encounters an EOM marker, the integrated circuit 10 stops playing and generates an interrupt. Similarly, when the integrated circuit 10 is in overflow, which indicates that a Record, Playback or Message Cueing cycle has reached the end of the last row in the circuit 10 memory, the circuit 10 generates an interrupt and stops the operation.

In implementing the flexible message management system of the present invention, three criteria must be met. First, a scheme for reading the address of the row pointer must be provided. Second a flag for detecting the end of the current row must also be provided. Third, the ability to load a new address (from the address register at the end of the current row, instead of incrementing the row pointer to the subsequent row), must be provided.

To accomplish these, first, the status bits EOM and OVF and the row pointers P15–P0 are shifted out from the output shift register 46 to the master device via the MISO pin during an SPI transfer. Second, the RAC signal is provided for the early detection of an end of the current row. As an example, for an 8 KHz sample rate, the maximum duration of a message in one row is 200 ms. The RAC signal stays high (output held high by an external pull-up resistor) for 175 ms and changes to a low state for 25 ms. This waveform is periodic, and it tracks the sample rate of the internal 512 KHz oscillator and continues as long as the system 10 is recording or playing. Thirdly, the IAB bit is provided in the control register 44 to control the manner in which the row address counter is loaded. If the IAB bit is set ("1"), the row address increments to the following row at the end of the current row. If the IAB bit is reset ("0"), a new address is loaded into the row address counter. This new address is the content of bits A15–A0 of the SPI input shift register 44. The select logic 40 generates the appropriate control signals based on the value of the IAB bit.

Figure 3A:
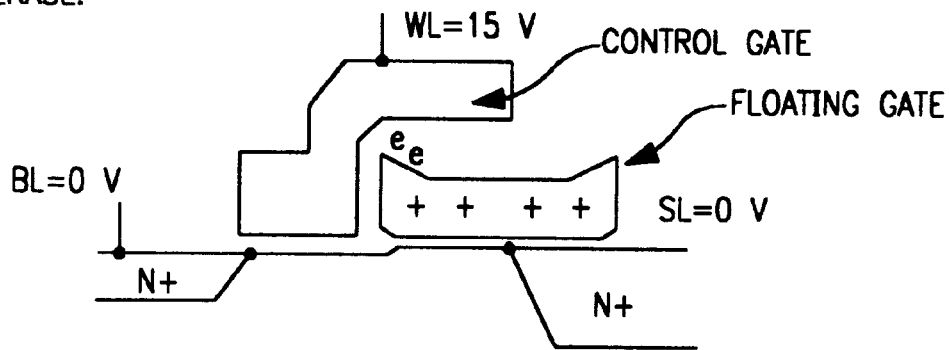
FIG. 3A illustrates a cross section of a memory cell in the ERASE, PROGRAM, and READ modes.
Figure 3A:
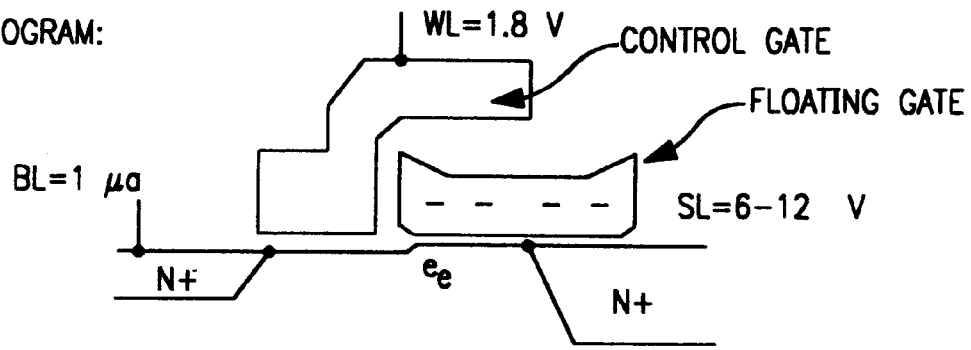
Figure 3A:
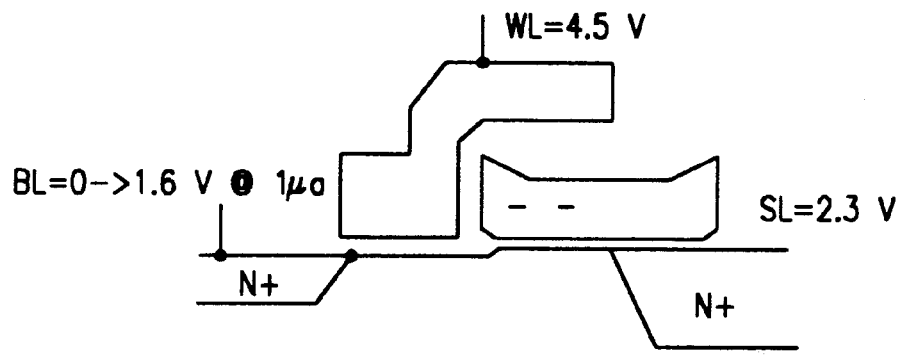

FIG. 3A illustrates a cross section of a memory cell in the ERASE, PROGRAM, and READ modes. The cross section of the memory cell is shown along the bit line. The memory cell is a source side injection flash memory cell as described in Silicon Storage Technology Inc.("SST"), 1995 Datasheet, pages 17.1 to 17.7. The cell is erased via poly-poly field enhanced electron tunneling by applying a high voltage (typically 15 volts) on the control gate and zero voltage on the source and drain. The electrical field is greatly enhanced due to a structural tip of the floating gate pointing from the floating gate toward the control gate. This results in a moderate voltage required during the ERASE mode, which reduces the overall field stress for the oxide.

Programming of the memory cell is through source side channel hot electron injection by applying a high voltage to the source (e.g., 6 to 12 volts), a small bias current sourcing from the drain, and a bias voltage on the control gate. During the PROGRAM mode, the select transistor of the split gate flash memory cell is operating in the saturation region. A very high lateral electrical field is developed across the gap between the select transistor and the floating gate transistor, more precisely between the channel pinch-off point of the select transistor and the channel region controlled by the floating gate. On this high field region electron-hole pairs are generated and the electrons are swept up to the floating gate by the vertical field between the substrate and the floating gate. This mechanism is much more efficient than the conventional hot electron programming, resulting in microamp current instead of close to milliamp current of the latter for programming. The programming is inhibited by turning off the current bias and pulling the drain to an inhibit voltage level, typically greater than or equal to the programming gate voltage (e.g., 2.3 volts).

During the READ mode, a bias voltage is applied to the source (e.g., 2.3 volts), a slightly higher voltage is applied to the control gate (e.g., 4.5 volts), and a small current is biased through the drain (e.g., 1 $\mu$A).

Figure 3B:
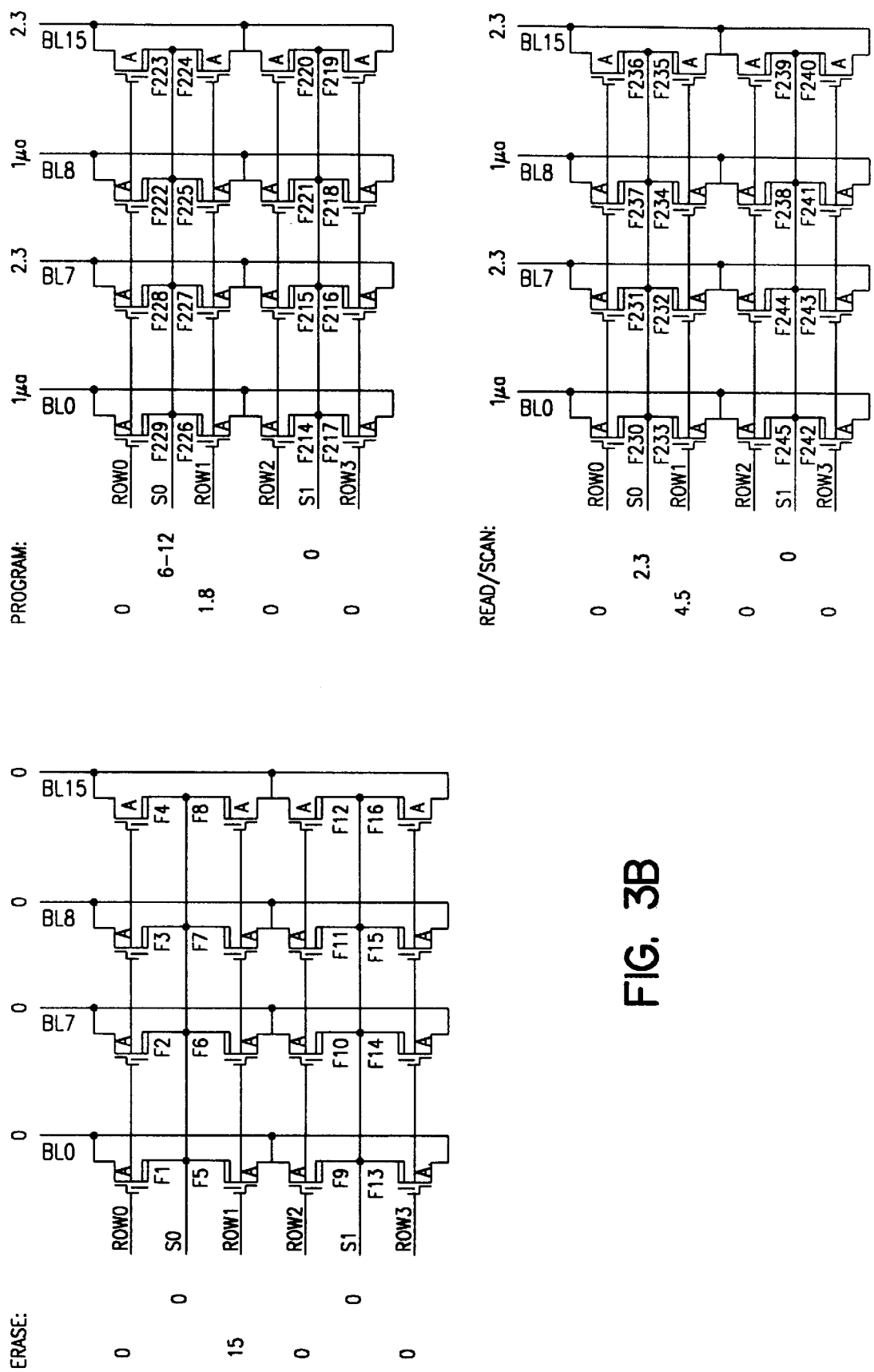
FIG. 3B is a 4×4 memory array illustrating the ERASE, PROGRAM, and READ modes of a selected memory cell.

FIG. 3B is a memory array illustrating the ERASE, PROGRAM, and READ modes of a selected memory cell.

Referring to FIG. 3B, a portion of the memory array is shown. In the ERASE mode, an entire row (devices F5–F8) of memory cells are erased by applying a high voltage (e.g., 15 volts) to ROW1 and zero volts on S0 to the sources of the devices. The devices turn on and cause the drains to be pulled to zero volts. Devices in rows ROW0, ROW2, and ROW3 are not erased as the ROW voltages are held at zero volts.

In the PROGRAM mode, devices F226 and F225 are simultaneously programmed (by way of separate column drivers driving bit lines BL0 and BL8) during a scan. A high voltage is applied to S0 (e.g., between 6–12 volts), a bias voltage is applied to ROW 1 (e.g., 1.8 volts), and a bias current (e.g., 1 $\mu$A) is sourced from the drains of devices F226 and F225 by way of bit lines BL0 and BL8, respectively. Devices F227 and F224 are not programmed as the drains of the devices are taken to an inhibit voltage level VINH (e.g., 2.3 volts). In addition, devices in rows ROW0, ROW2, and ROW3 are left un-programmed.

In the READ mode, devices F233 and F234 are simultaneously read (by way of separate column drivers). A bias voltage (e.g., 2.3 volts) is applied to S0, a slightly higher voltage is applied to ROW1 (e.g., 4.5 volts), and the drains of devices F233 and F234 are biased with a small current (e.g., 1 $\mu$A). Devices F232 and F235 are not read as an inhibit voltage level VINH is applied to the their respective drains (BL7 and BL15). In addition, devices in rows ROW0, ROW2, and ROW3 are left unread.

Since the memory cells in the SST 1995 Datasheet were used as standard digital memory cells, i.e., only two levels per cell were needed, the operating conditions were easily achieved. However, due to the flash memory cells being subjected to applications involving analog multilevel storage, the programming algorithm and the operating method is elaborate to achieve the required resolution (e.g., on the order of one part in 250 or better) within an available analog operating window.

Figure 4A:
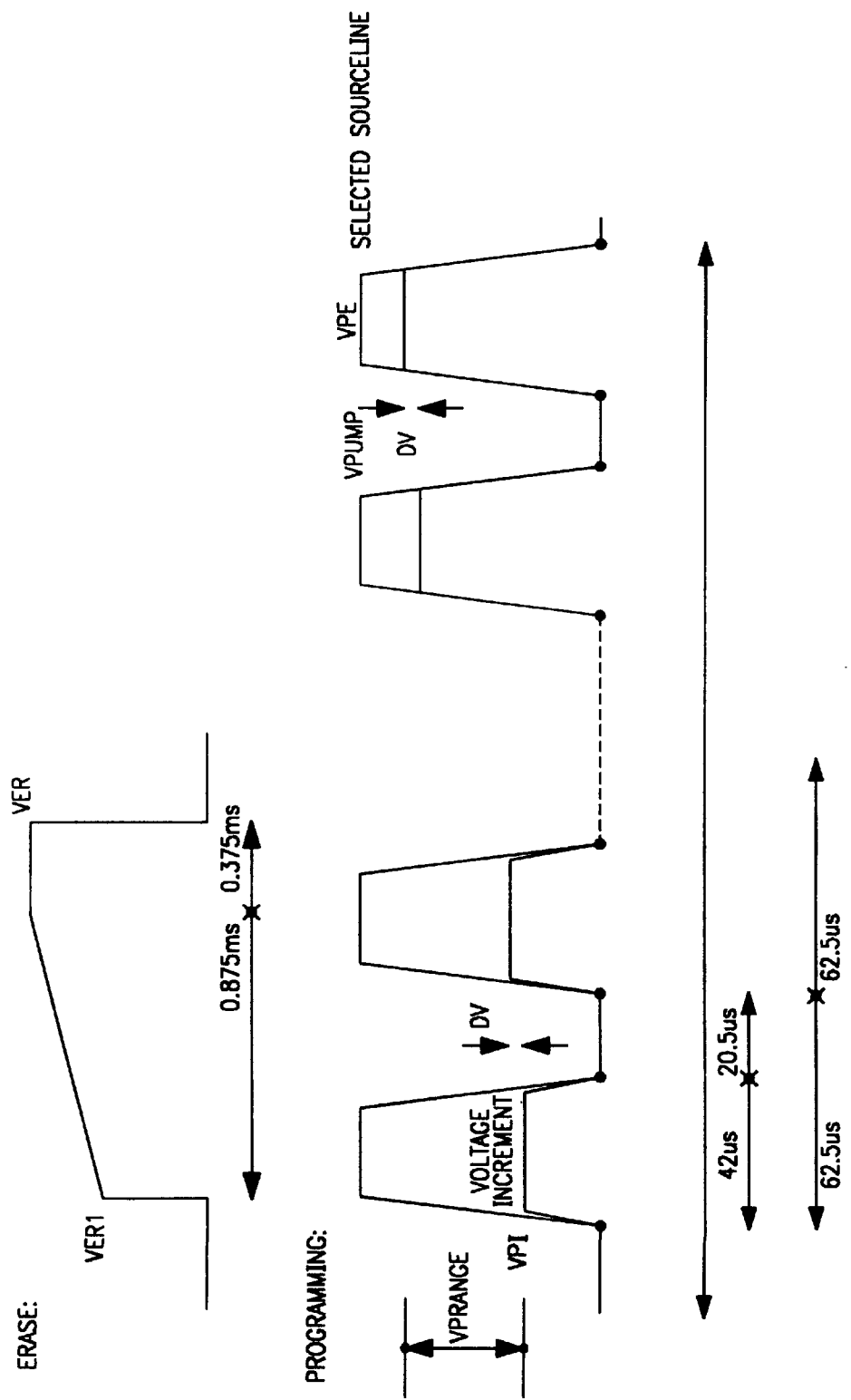
FIG. 4A is a timing diagram illustrating a trimmable programming algorithm of the present invention.

FIG. 4A is a timing diagram illustrating a trimmable programming algorithm of the present invention. For each row in the memory array, the writing operation begins with an ERASE operation of an entire row. An initial ERASE voltage VERI (e.g., 8 volts) is applied to the gates of the flash memory cells of the selected row, which ramps up at a constant rate for $t_r$ ms (e.g., 0.875 ms) until a maximum ERASE voltage VER (e.g., 15 volts) is reached. VER is then applied for $t_{fl}$ ms (e.g., 0.375 ms).

After the ERASE operation, a series of multilevel program/read/compare cycles begin for a scan of flash memory cells. For each program/read/compare cycle, the programming voltage level is raised from that of the previous cycle in a controlled manner by an algorithmically determined increment. The number of programming pulses are determined by the smallest allowable pulse width divided by the total available programming time for each scan. In the preferred embodiment, the total programming time for a scan equals to the number of columns multiplied by the sampling rate minus the erase time, i.e., (200×125 $\mu$s)−1.25 ms=23.75 ms. In the preferred embodiment, each program portion of the program/read/compare cycle takes 42 $\mu$s. At the end of the eighth scan, the row counter is incremented and the process repeats.

The program parameters are initially set up for optimized operation, which includes the initial programming voltage VPI, the step voltage DV, the programming bias current IPROGBIAS, and the actual programming time interval TWRITE. The program operation enables the selected array cells (e.g., a scan) into programming state for a fixed amount of time under precisely controlled voltages and currents. Ideally, VPI is set as close to the voltage level where the actual programming begins. VPI is trimmable (i.e., adjustable) since the actual programming range (also referred to as cell window) may be shifted up or down as the process of the memory array varies. This shift in the cell window could move VPI outside of the available programming window if left un-adjusted. Thus, the trimming of the initial programming voltage VPI allows the chip programming window to follow the variation of the actual cell window.

The step voltage, DV, specifies the programming voltage increment for each cycle, which is needed to optimize resolution for a given voltage range. For a given number of available pulses and for a given available cell window, DV is trimmable for the operating window to cover the cell window. That is, if the cell window is larger, then the step voltage DV is larger. The programming bias current, IPROGBIAS, specifies the programming current, which is trimmable for two reasons. First, IPROGBIAS is trimmable in order to use a minimum bias current such that all the memory cells are still programmed within an allocated time. This results in a minimum loading to the charge pump (voltage multiplier). The second reason that IPROGBIAS is trimmable is that by adjusting the programming bias current, the cell window can be shifted up or down for optimal operating range.

The read parameters are also set up for optimized operation, which includes the read bias current, IREADBIAS, the select gate bias VSGRD, and the common source bias VCSRD. The read operation reads out the exact voltage levels from the selected flash memory cells. The compare operation starts the actual comparison of the input held signal to the stored signal in the memory cell. In the preferred embodiment, each read/compare portion of the program/read/compare cycle takes 20.5 $\mu$s. Thus, in the embodiment shown, up to a total of 380 pulses (23.75 ms/62.5 $\mu$s) may be applied to each memory cell. The read operation is in a source follower configuration, as described in U.S. Pat. No. 5,220,531 issued to T. Blyth et al. and assigned to the assignee of the present invention.

Due to the specific nature of flash memory cells, that is different from EEPROM cells, several critical considerations must be taken into account such as avoiding read disturb conditions and minimizing read error conditions while still maintaining a read voltage window. IREADBIAS is trimmable to adjust the read voltage window and to minimize the read error due to various pass gates and interconnect parasitics. For such a source follower read configuration, there is a very low current bias in order to minimize the read error and is described in an allowed U.S. patent application Ser. No. 08/629,729 by H. V. Tran et al. The select gate bias voltage, VSGRD, is trimmable to avoid the read disturb, which manifests as a soft erase from the floating gate to the control gate (the same as select gate). The higher the VSGRD the worse the read disturb, while the lower the VSGRD the smaller the read voltage window. The smaller read window is due to the source following the gate as in the source follower configuration. Thus, VSGRD trimming can optimize the read voltage window.

The record operation begins with the sampling of the input voltages into the sample and hold capacitors in each of the column drivers COLDRV0 to COLDRV199, starting from COLDRV0. The sampling clock PHIN is typical an 8 KHz clock. The shift registers inside each column driver sequentially enables its respective sample and hold circuits, one at a time, for each sampling clock period. When column driver COLDRV199 finishes sampling, the actual writing of the memory cells then begins for that scan.

The play operation begins with the first column driver COLDRV0 reading and outputting the voltage of the first memory cell. The shift registers inside the respective column drivers sequentially enable their respective memory cell outputs, one at a time, for each sampling clock PHIN period from COLDRV0 to COLDRV199. When the COLDRV199 finishes reading (i.e., the end of a scan), the process repeats at the first column as driven from the wrap-around of the cyclic column shift register. At the end of the eighth scan, the row counter is incremented and the entire process repeats for the next row of flash memory cells. It is critical during the play operation to sense without introducing disturb error and read error, as described above.

Figure 4B:
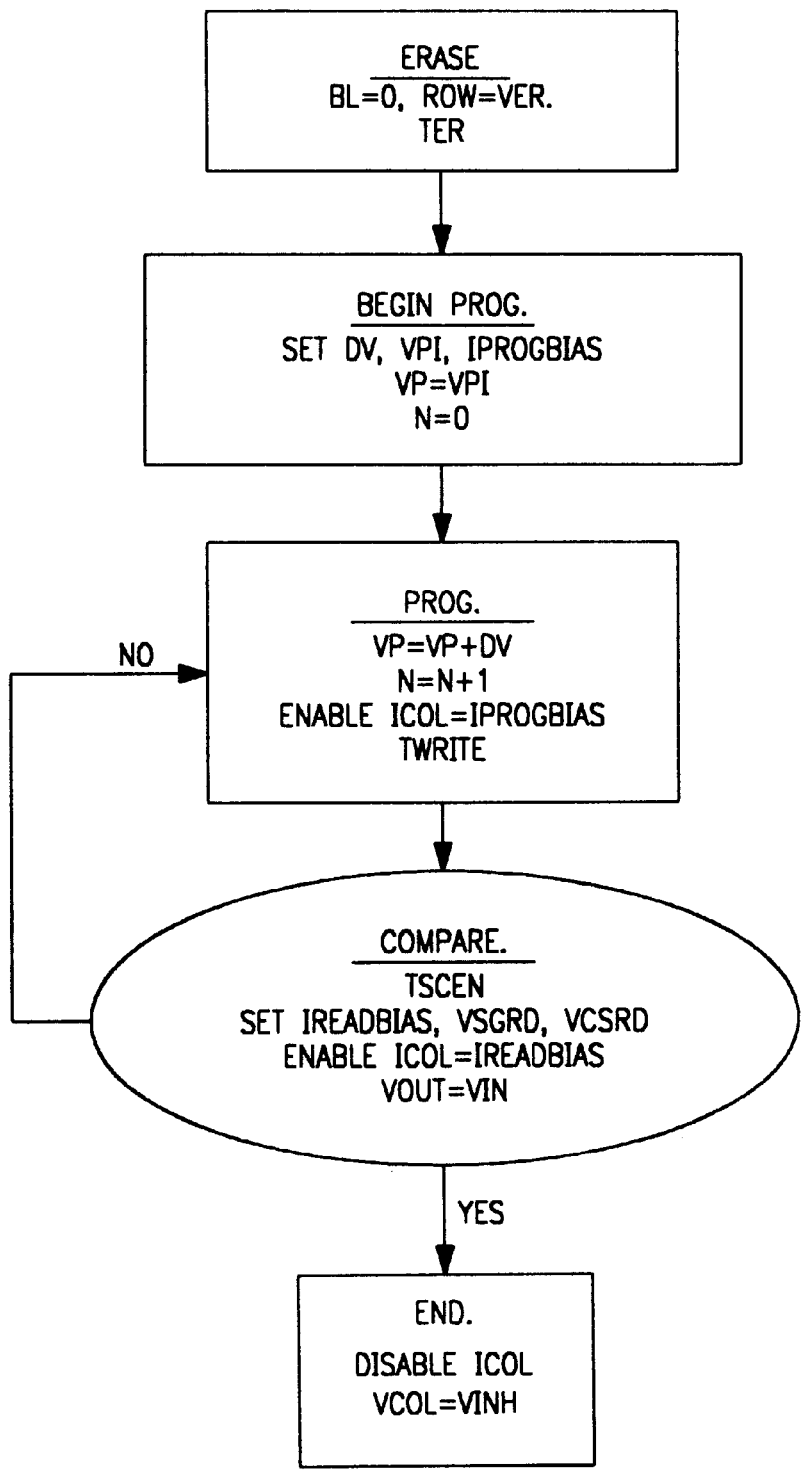
FIG. 4B is a flow diagram illustrating the trimmable programming algorithm of the present invention.

FIG. 4B is a flow diagram illustrating the trimmable programming algorithm of the present invention. At Step 402, an ERASE operation is performed for a row of flash memory cells. At step 404, the algorithm sets the initial parameters for a program/read/compare cycle. DV and IPROGBIAS are set, VP is initialized to VPI, and a counter N is initialized to zero. At step 406, a program cycle is initiated where the programming voltage is increased by DV and N is incremented by one. Step 408 is a read and compare operation. IREADBIAS, VSGRD, VCSRD, and the appropriate columns are enabled and each column driver reads the voltage of its respective memory cell. If the voltage of the memory cell (VOUT) is equal to the sampled input voltage (VIN) or N is equal to Nmax, the algorithm proceeds to Step 410 where the column voltage is set to VINH and the program/read/compare cycle is complete. Otherwise the algorithm jumps back to Step 406 where N is incremented. The algorithm performs Steps 406 and 408 until VOUT is equal to VIN or N is equal to Nmax.

Voltage levels and timing information are summarized in Table 3 while trimming values for the system are summarized in Table 4.

TABLE 3

High Voltage Pulse Level and Timing

|  | ERASE | PROGRAM |
| --- | --- | --- |
| t$_r$ | 0.875 ms | 2 V/us |
| t$_n$ | 0.375 ms | 40 us – tr |
| t$_f$ | 2 us | ~1 us |
| t$_{pwd}$ | 1.25 ms | 62.5 us |
| VE | 15 V | — |
| VP (program range) | — | 6–12 V |
| DV (step) | — | 16 mV |
| Number of pulses | 1 | 380 |

TABLE 4

PROGRAM/READ Trim Table

|  | Value | Vstep | # of steps | # of trimbits |
| --- | --- | --- | --- | --- |
| VPI (V) | 7 +/– 2 | 0.5 | 8 | 3 |
| DV (mV) | 16 +/– 10 | 1.25 | 16 | 4 |
| IPROGBIAS ($\mu$a) | 0.02, 0.08, 0.17, 0.25, 0.33, 0.42, 0.5, 0.58 | — | 8 | 3 |
| IREADBIAS ($\mu$a) | 0.075, 0.3, 0.6, 0.9, | — | 8 | 3 |

TABLE 4-continued

PROGRAM/READ Trim Table

| | Value | Vstep | # of steps | # of trimbits |
|---|---|---|---|---|
| VSGRD (V) | 1.2, 1.5, 1.8, 2.1 3.9, 4.2, 4.5, 4.8 | 0.3 | 4 | 2 |

Figure 5:
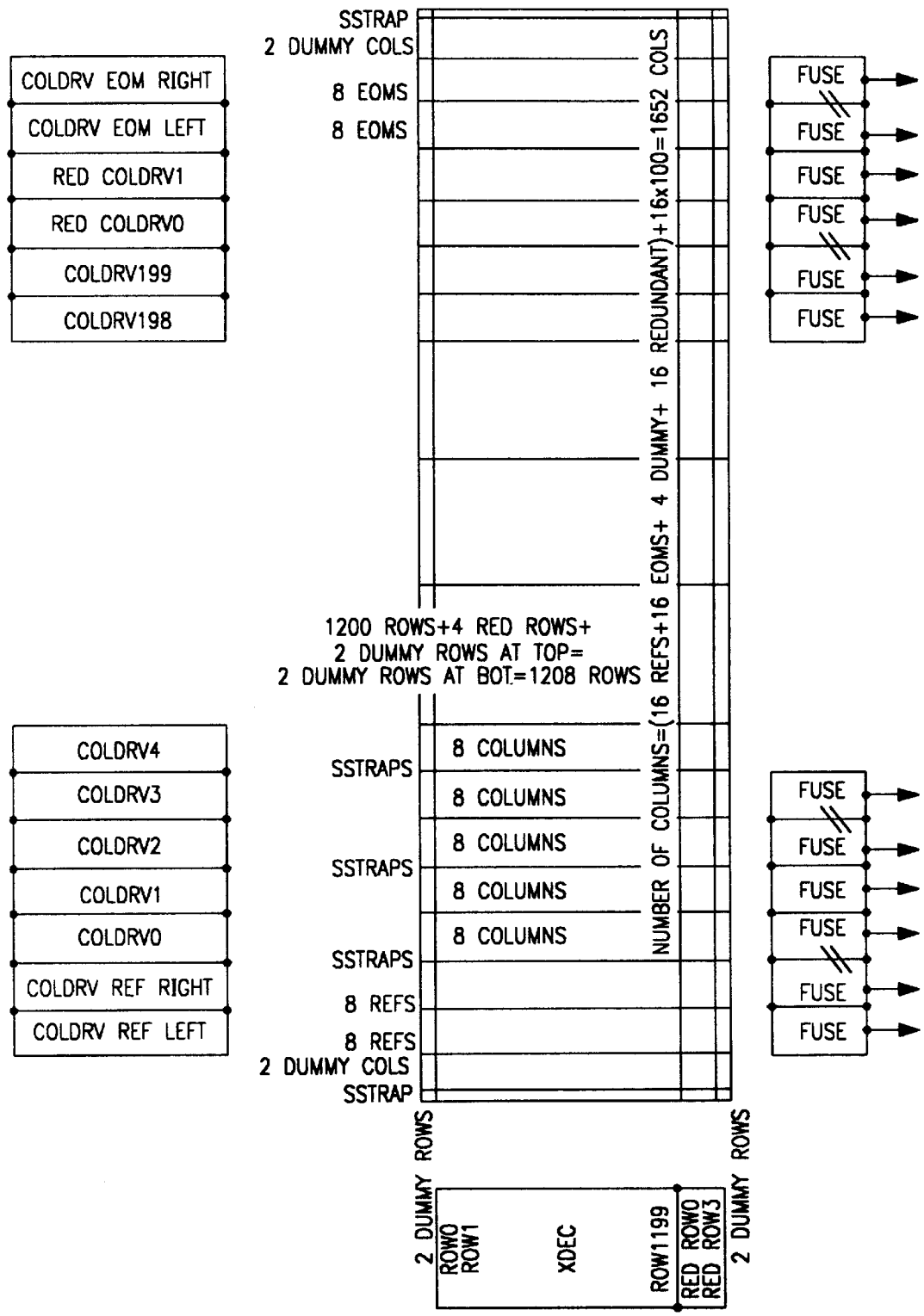
FIG. 5 illustrates an array architecture of the present invention.

FIG. 5 illustrates the array architecture 20 of FIG. 1. Referring to FIG. 5, the array architecture includes 200 column drivers (COLDRV0 to COLDRV199), 2 EOM column drivers (COLDRV EOM LEFT/RIGHT), 2 reference column drivers (COLDRV REF LEFT/RIGHT), and 2 redundancy column drivers (RED COLDRV0 and RED COLDRV1). Each column driver drives 8 columns. Thus, the array of flash memory cells includes 1652 columns ((8×206 columns)+4 dummy columns) and 1208 rows (1200 rows+4 redundancy rows+4 dummy rows).

The reference storage columns are located on the left hand side of the array and are used to store a reference signal at the same time that an adjacent storage memory cell stores a signal sample. On playback, the stored reference signals for the row of the array are read back and weighted relative to each other in accordance with the relative row position of the signal storage cell being simultaneously read. The output signal is taken as the difference between the signal sample read back and the reference signals. This differencing places many error sources in the common mode, thereby substantially eliminating the same from the output signal. The reference system is described in U.S. Pat. No. 5,126,967 issued to Simko and is assigned to the assignee of the present invention.

The redundancy rows shown in FIG. 5 are described in U.S. Pat. No. 5,642,316 issued to Hieu Van Tran et al. and assigned to the assignee of the present invention, the contents of which are incorporated by reference. The redundancy columns shown in FIG. 5 is described in co-pending U.S. patent application Ser. No. 09/005,098 entitled "Method and Apparatus of Column Redundancy For Non-Volatile Analog and Multilevel Memory Integrated Circuits" by Hieu Van Tran and James Brennan, Jr., the contents of which are incorporated by reference. In addition, the FUSE circuits is described in co-pending U.S. patent application Ser. No. 09/005,074 entitled "Trimbit Circuit for Flash Memory Integrated Circuits" by Peter Holzmann et al., the contents of which are incorporated by reference. The FUSE circuits provide the trimmable bits for the trimbit circuit.

A metal strapping SSTRAP is placed along the source line of every 16 cells to reduce the voltage drop along the selected source line during programming. This is critical during programming. For example, for a 1 $\mu$A bias current with 200 cells being programmed in parallel, the total current can vary from a maximum of 200 $\mu$A to a minimum of 1 $\mu$A. If the parasitic source line resistance is 1000 ohms, a voltage drop could vary from 200 mV=(200 $\mu$A×1000 ohms) to 1 mV. At its maximum, this variation is much more than one programming voltage step. To solve this problem, metal strappings has been chosen such that the maximum voltage drop along the source lines are much less than one programming voltage step.

Figure 5A:
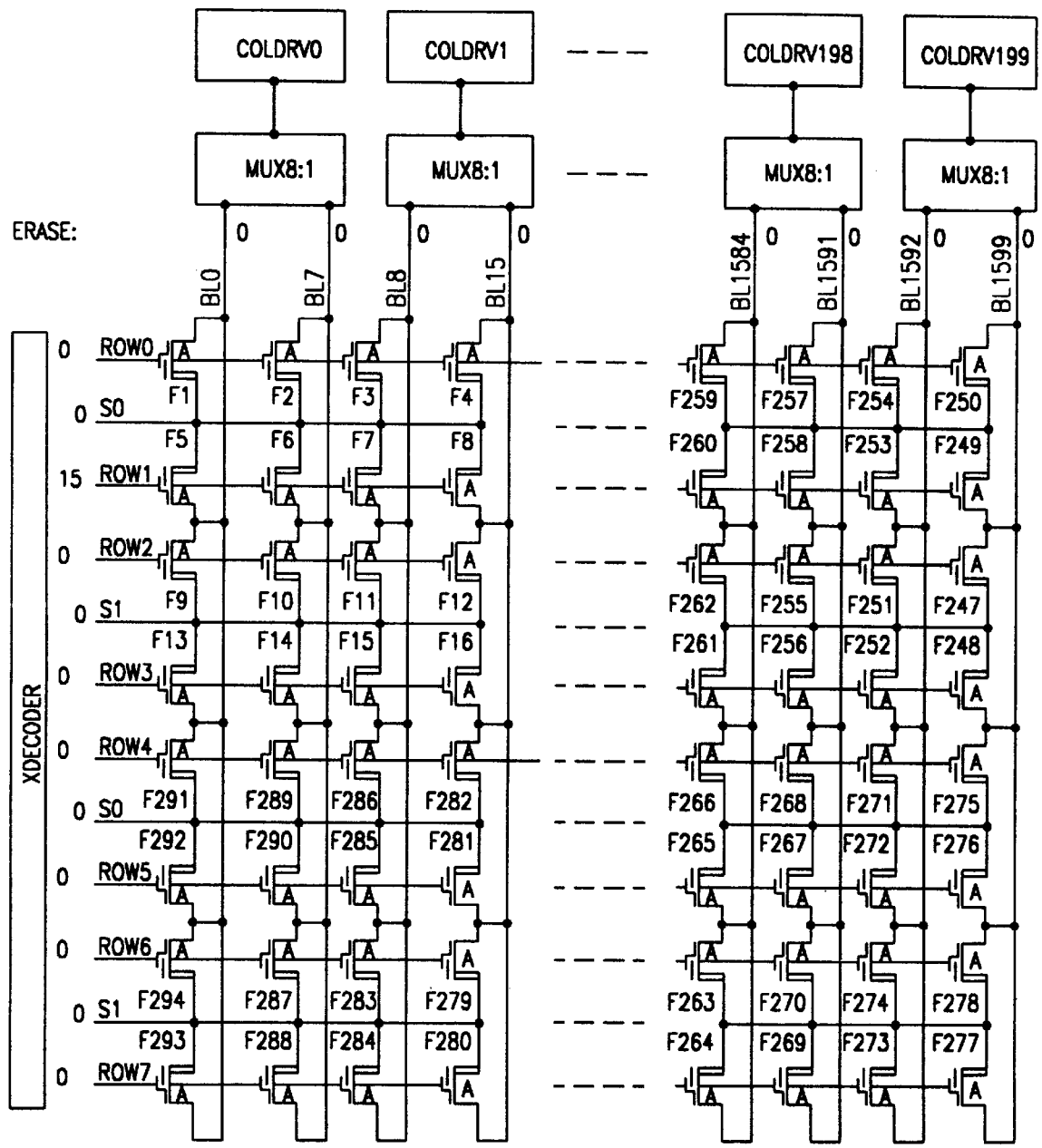
FIG. 5A is a memory array architecture illustrating the ERASE mode for a row of selected cells.

FIG. 5A is a memory array architecture illustrating the ERASE mode for a row of selected cells. In the ERASE mode, the column MUXes are disabled. As shown in FIG. 5A, a high voltage (e.g., 15 volts) is applied on ROW1 to the gates of devices F5–F8, . . . , F260, F258, F253, F249 and zero volts is applied on S0 to the sources of the devices. The devices in ROW1 turn on and cause their respective drains to be pulled down to zero volts. The gates of devices in the non-selected rows are kept at zero volts to prevent them from being erased.

Figure 5B:
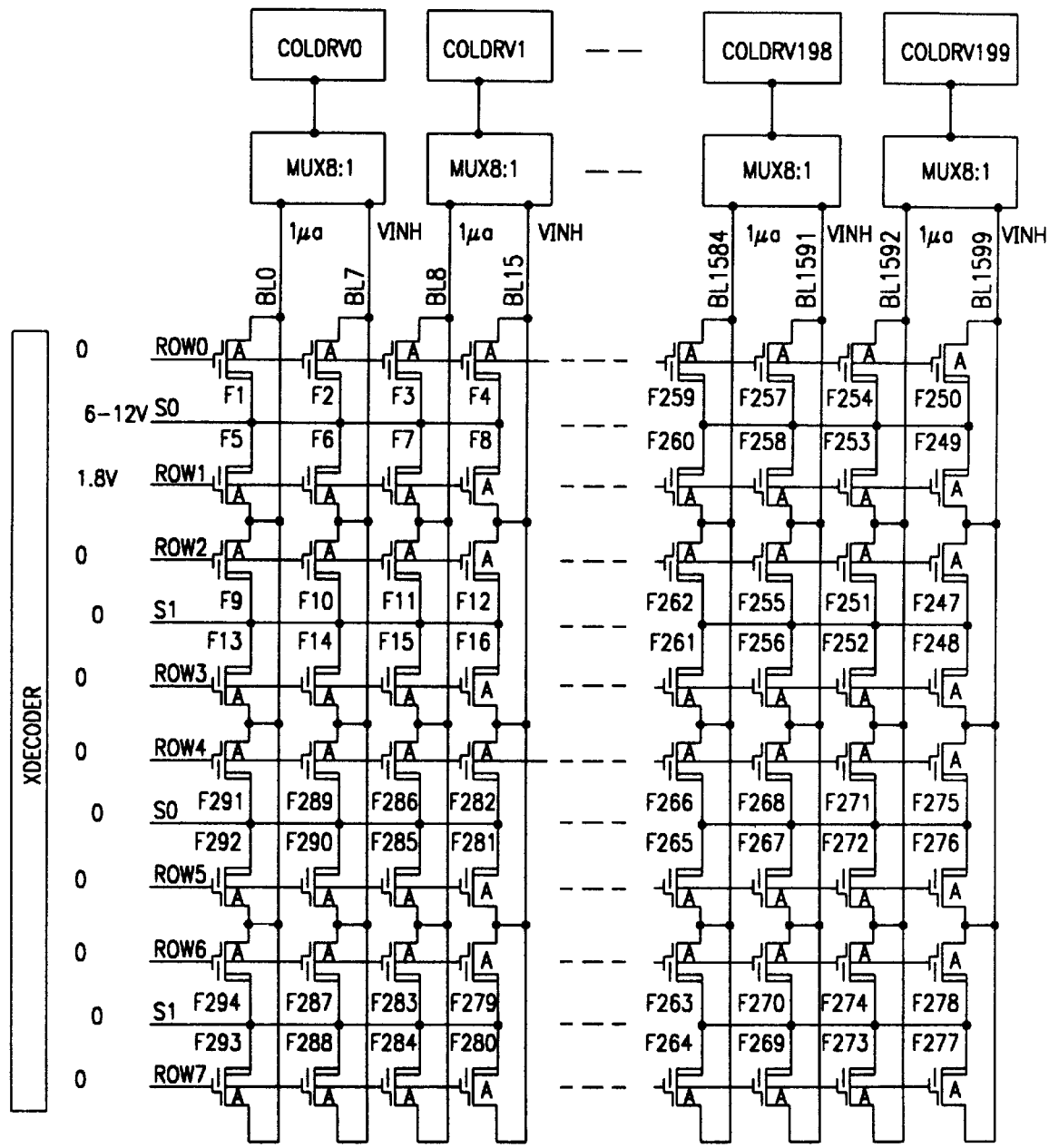
FIG. 5B is a memory array architecture illustrating the PROGRAM mode for a scan of selected cells.

FIG. 5B is a memory array architecture illustrating the PROGRAM mode for a scan of selected cells. Referring to FIG. 5B, a program voltage (e.g., 6–12 volts) is applied on S0 to the sources and a bias voltage (e.g., 1.8 volts) is applied on ROW1 to the gates of the devices in ROW1. During a scan, a bias current (e.g., 1 $\mu$A) is applied to the drains of devices F5, F7, . . . , F260, F253 (i.e., the devices in the first column of each column driver) simultaneously for programming. The programming algorithm is described above with respect to FIGS. 4A and 4B. An inhibit voltage VINH is applied to the drains of the devices in the remaining columns of each column driver (i.e., F6, F8, . . . , F258, F249) to prevent them from being programmed. The devices in the other rows are disabled.

Figure 5C:
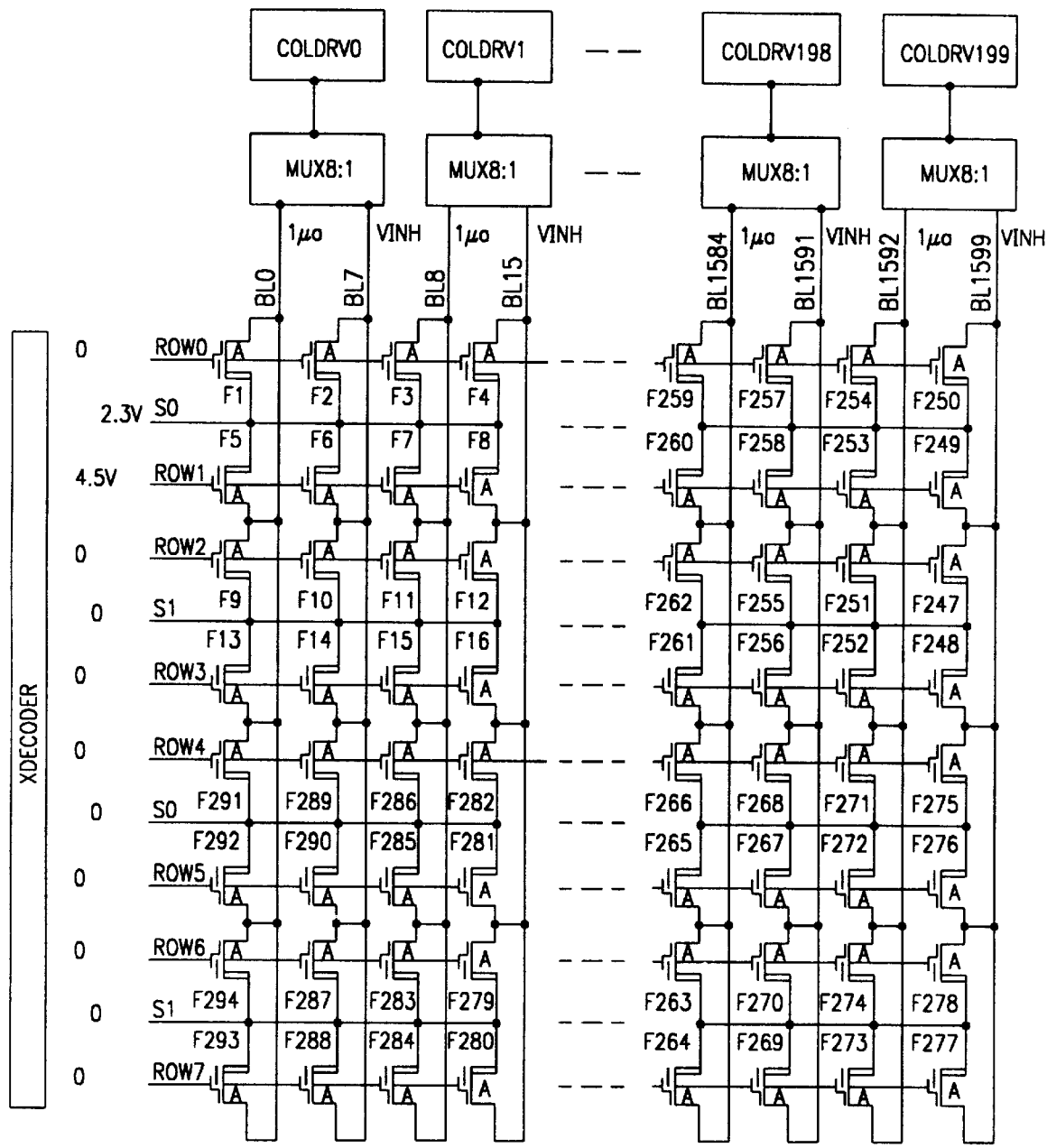
FIG. 5C is a memory array architecture illustrating the READ mode for a scan of selected cells.

FIG. 5C is a memory array architecture illustrating the READ mode for a scan of selected cells. Referring to FIG. 5C, first and second bias voltages are applied on ROW1 and S0 to the gates and sources, respectively, of the devices in ROW1. During a scan, a bias current is applied to the drains of devices F5, F7, . . . , F260, F263 simultaneously for reading. An inhibit voltage VINH is applied to the drains of the devices in the remaining columns of each column driver (i.e., F6, F8, . . . , F258, F249). The devices in the other rows are disabled.

Figure 5D:
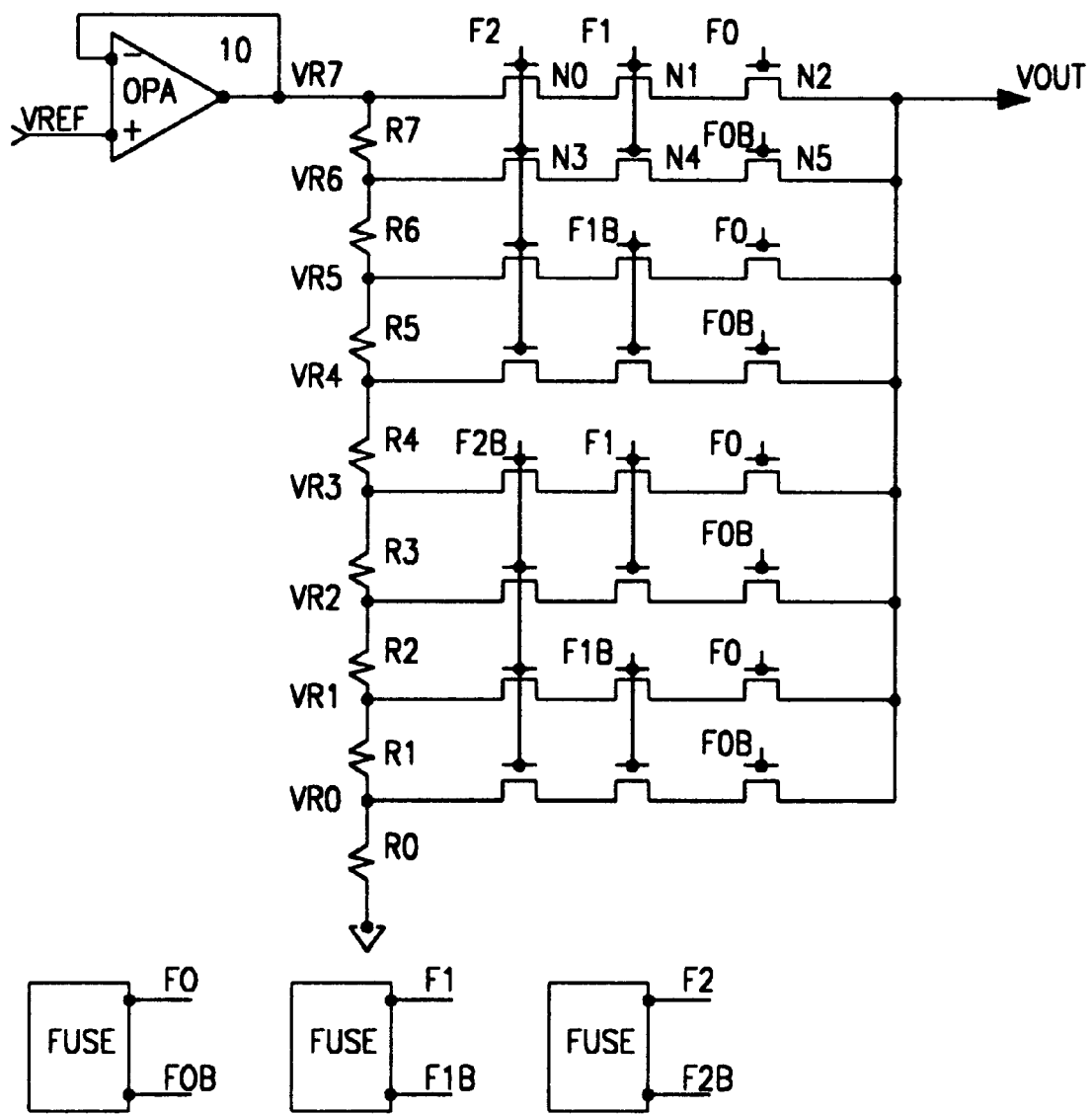
FIG. 5D illustrates an exemplary voltage trimbit circuit.

FIG. 5D illustrates an exemplary voltage trimbit circuit, which is a three-bit binary voltage trimbit circuit. The output VOUT assumes one out of eight possible voltage levels VR0–VR7 depending on the FUSE outputs F0, F1, and F2. For example, if F2, F1, and F0 equals 111, devices N0, N1, and N2 are enabled and all other devices are disabled, making VOUT equal to VR7. VR0–VR7 can be set to desired voltage levels by selecting appropriate values for the corresponding resistor R0–R7. The voltage trimbit circuit is extendible to provide any voltage resolution (e.g., 32 levels).

Figure 5E:
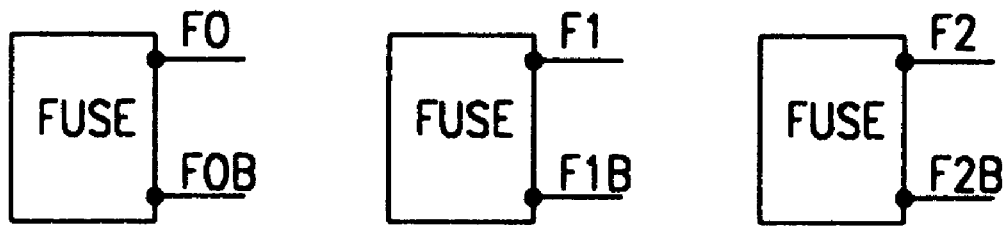
FIG. 5E illustrates an exemplary current trimbit circuit.
Figure 5E:
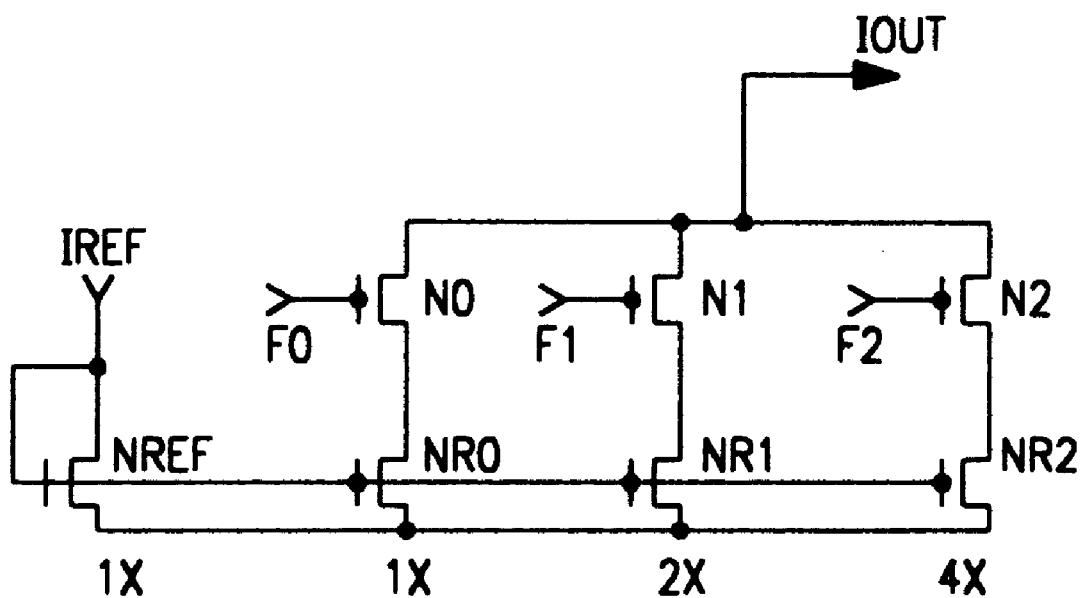

FIG. 5E illustrates an exemplary current trimbit circuit. The output current IOUT assumes one out of eight possible current levels depending on the FUSE outputs F0, F1, and F2. For example, if F2, F1, and F0 equals 100, N2 is enabled and N0 and N1 are disabled, making IOUT equal to 4×IREF. The current level may be fine tuned by selecting appropriate sizes for the devices NR0, NR1, and NR2. The current trimbit circuit is extendible to any desired current resolution.

Figure 6:
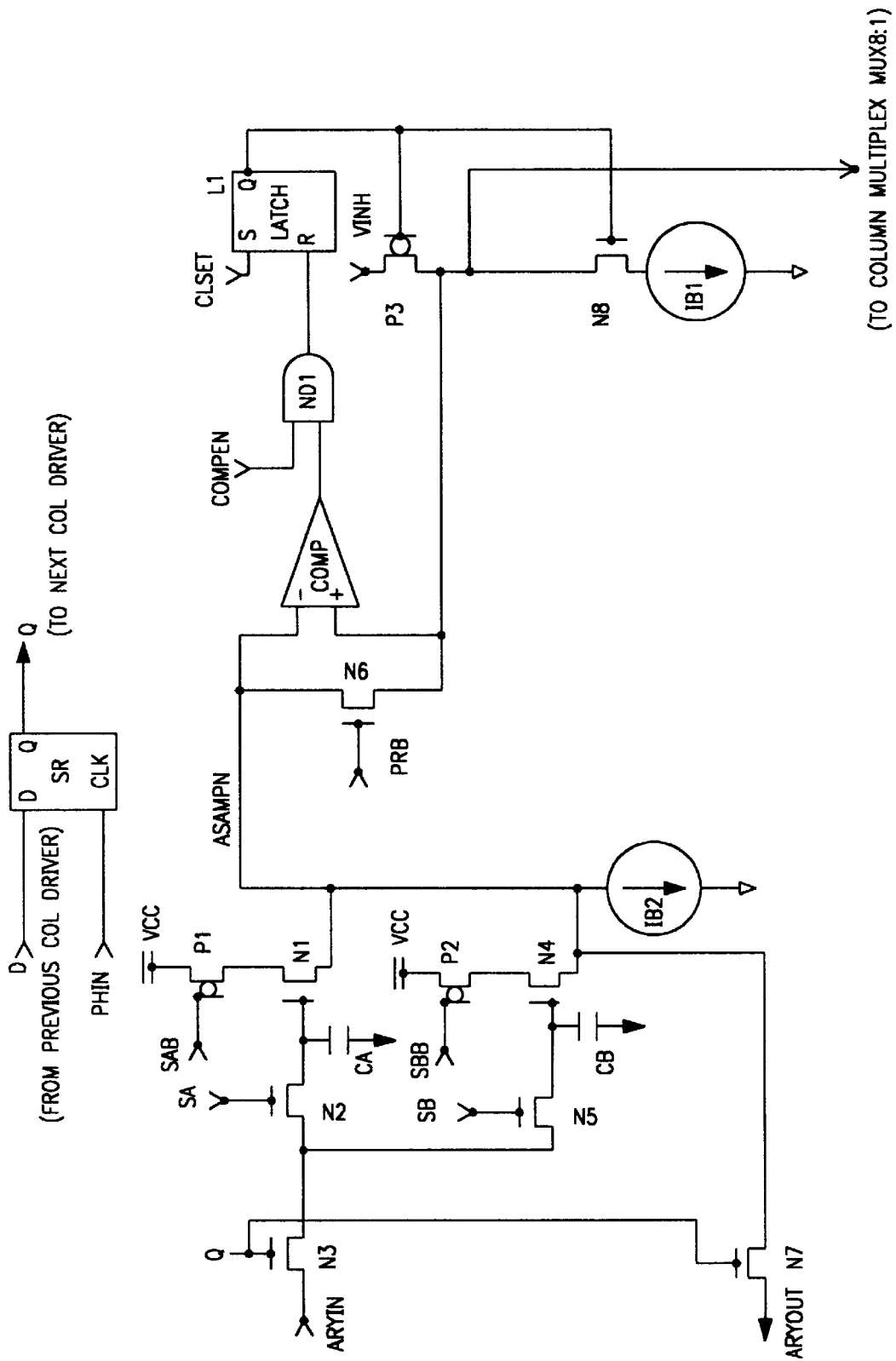
FIG. 6 illustrates a preferred embodiment of a column driver circuit of the present invention.

FIG. 6 illustrates a preferred embodiment of a column driver circuit of the present invention. The column driver circuit includes two banks of sample and hold circuits. The first bank includes devices P1, N1, N2, and CA and the second bank includes devices P2, N4, N5, and CB. SA and SB are non-overlapping signals. Moreover, SAB is an inverted signal of SA and SBB is an inverted signal of SB. One bank is used for programming a sampled input signal while the other bank is simultaneously sampling an input signal. N3 is enabled by the shift register SR. IB2 provides the bias current for N1 and N4. When in sampling mode, a typical op amp (not shown) is used in a feedback configuration to drive the input signal ARYIN. ARYOUT is coupled to the negative terminal of the op amp and an input analog signal is coupled to the positive terminal of the op amp. By using the op amp in the negative feedback loop, the input voltage is always exactly duplicated at the ASAMPN signal.

The COMP is a typical MOS comparator. The COMP and ND1 are used to compare the input signal, which is coupled to the negative terminal of the COMP, with the signal output from the flash memory cell, which is coupled to the positive terminal of the COMP. The result is latched in a latch L1. The compare enable signal COMPEN is used to strobe the comparator in the compare mode. When the input signal is substantially the same as the signal read from the flash memory cell, the output of COMP and ND1 goes high which causes the output of L1 to go low. This turns off N8 to disable the current source IB1 and enables P3 to pull up the column to an inhibit voltage VINH.

Transistor N6 is turned on by signal PRB when in the play back mode to couple the voltage from the flash memory cell to the output ARYOUT. In all other modes, transistor N6 is turned off. The shift register SR is used as an address decoding to enable one column driver at a time, starting from column driver number 1 (COLDRV0) sequentially to column driver number 200 (COLDRV199) in the sampling and playing modes. The sampling clock PHIN is applied to the CLK input of the shift register SR. In the preferred embodiment, PHIN is 8 KHz.

Figure 6A:
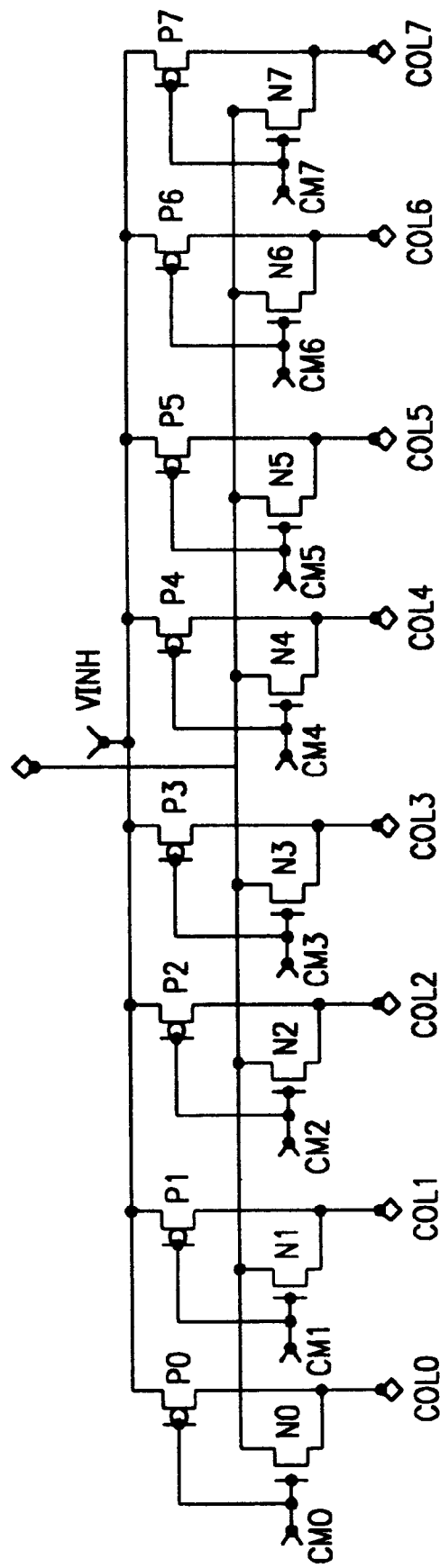
FIG. 6A illustrates a preferred embodiment of a column MUX of the present invention.

FIG. 6A illustrates a preferred embodiment of a column MUX of the present invention. Referring to FIG. 6A, the output of the column driver is coupled to COLMUX. Signals CM0–CM7 control the column that COLMUX is coupled to. Only one of the signals CM0–CM7 is on at any one time. Moreover, the seven remaining columns that are not coupled to COLMUX are pulled to the inhibit voltage, VINH, by way of P-channel devices P0–P7.

Figure 7A:
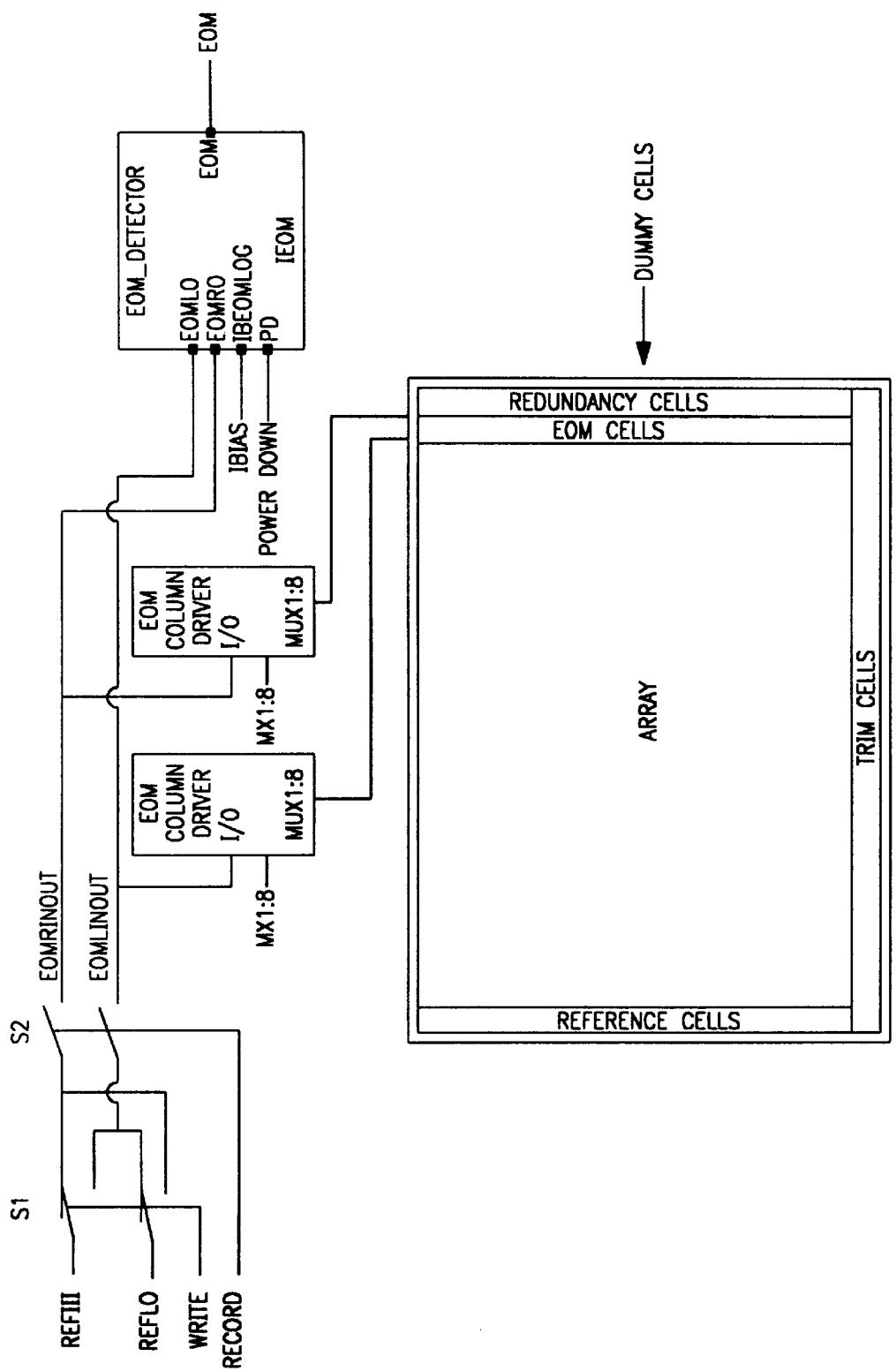
FIG. 7A illustrates an end of message ("EOM") scheme of the present invention.

FIG. 7A illustrates an end of message ("EOM") scheme of the present invention. With the ability to program and detect EOM markers, multiple messages may be stored in the memory array. EOM markers are programmed and read during each scan. Referring to FIG. 7A, an EOM detector circuit EOM_DETECTOR is used to determine whether an EOM marker has been set. There are two EOM column drivers (which is the same as the column driver shown in FIG. 6) and 16 EOM columns of flash memory cells. The EOM columns are located at the right hand side of the array.

In the RECORD mode, the input voltages for the EOM column drivers are the reference voltages REFHI and REFLO. With RECORD active, the reference voltages are switched by S2. If an EOM marker is to be programmed, the WRITE signal switches S1 which causes the left column driver to receive the reference REFHI and the right column driver to receive the reference REFLO. If there is no EOM marker to be programmed, the WRITE signal causes the switch S1 to coupled the reference REFLO to the left column driver and the reference REFHI to the right column driver. The flash memory cells in the EOM columns are programmed according to the same algorithm as that of all the other flash memory cells in the array. The EOM_DETECTOR circuit is not used in the RECORD mode; the POWER DOWN signal is active and the bias current IBIAS is zero.

In the PLAY mode, RECORD is inactive and the signals EOMRINOUT and EOMLINOUT are driven by the EOM column drivers; POWER DOWN is inactive and the EOM_DETECTOR circuit is active. When the flash memory cells in the EOM columns are read, the EOM_DETECTOR circuit generates an EOM output signal. If the signal voltage at EOMLINOUT is higher than the signal voltage at EOMRINOUT, the output EOM is high. On the other hand, if the signal voltage at EOMLINOUT is not higher than the signal voltage at EOMRINOUT, the output EOM is low.

In the preferred embodiment, there are 8 scans (200 memory cells/scan) and two EOM memory cells are used for each scan. During the recording of an input signal, if recording is stopped in the middle of a scan, the corresponding EOM memory cells are programmed with an EOM voltage to indicate an EOM condition. Thus, during playback, the EOM memory cells that are programmed with the EOM voltage will cause the playback operation to stop.

Figure 7B:
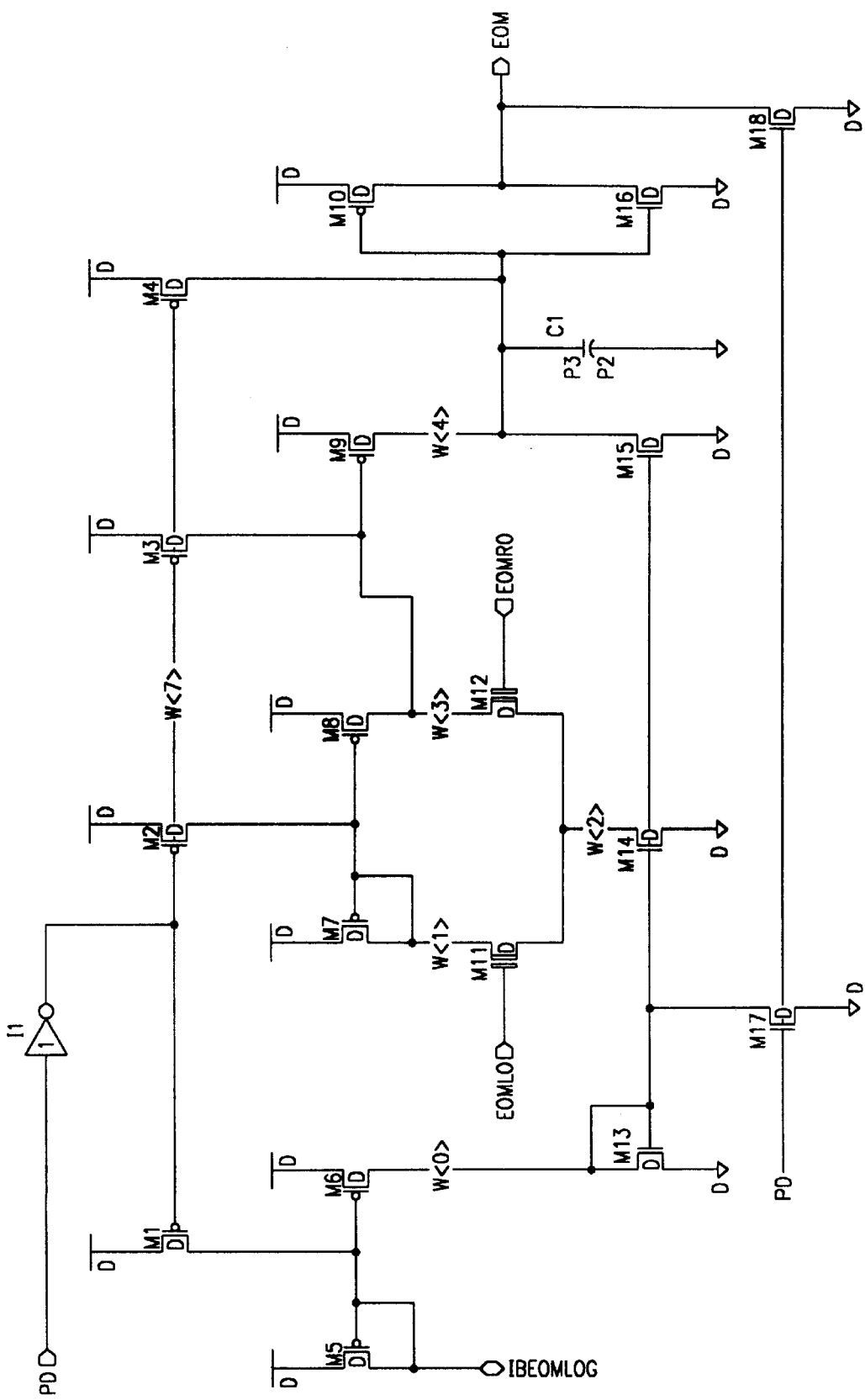
FIG. 7B illustrates the EOM_DETECTOR circuit of FIG. 7A.

FIG. 7B illustrates the EOM_DETECTOR circuit of FIG. 7A. Referring to FIG. 7B, the input signals EOMRO and EOMLO are connected to a differential input stage. The input MOSFETs (M11 and M12) are native devices with a low threshold voltage, for increased operating range. If the input signal EOMLO becomes larger than the input signal EOMRO, the voltage at node W<3> increases and MOSFET M9 turns off. Consequently, the voltage at node W<4> is pulled to zero and the EOM output goes high. If the input signal EOMLO becomes smaller than the input signal EOMRO, the voltage at node W<3> decreases to turn on MOSFET M9. Consequently, the EOM output goes low. Capacitor C1 is used to eliminate spikes and glitches when the input signals are switching. The circuit is biased by the bias current IBEOMLOG and can be powered down when PD is active. In the power down mode, the EOM output signal is low.

The advantage of this EOM scheme is the differential setup. The EOM markers are retrieved from the difference between the source follower voltages of two flash cells. One of the flash memory cells is programmed with a high voltage, while the other flash memory cell is programmed with a low voltage. Process and temperature variations are eliminated with the differential setup. Furthermore, as data retention will cause the source follower voltages of both flash memory cells to shift in the same direction, the EOM marker can still be retrieved correctly as the difference between the two cells.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An analog recording and playback system, comprising:
   an array having rows and columns of flash memory cells, the array including a pair of end of message ("EOM") cells for each scan in a row of flash memory cells, a pair of EOM cells to store a differential voltage for indicating that the corresponding scan is an end of a message;
   a column driver coupled to the columns of the array, the column driver to sample an analog signal, to incrementally program the sampled analog signal into a flash memory cell by applying a programming current and an increasing step voltage to the flash memory cell for each increment to increase a threshold voltage of the flash memory cell, and to read the sample from the flash memory cell; and
   a trim circuit to trim the programming current and alternatively the increasing step voltage to maintain a programming range within a flash memory cell window due to process variations in the flash memory cell.

2. The analog recording and playback system of claim 1 further comprising a plurality of column drivers coupled to a plurality of columns, the plurality of column drivers to each sequentially sample the analog signal, to simultaneously store the samples of the analog signal into a corresponding plurality of flash memory cells, and to each read out the sampled analog signal from the plurality of flash memory cells.

3. The analog recording and playback system of claim 1 further comprising a circuit to execute a plurality of program/read/compare cycles for incrementally programming the flash memory cell until a read operation reads out a voltage substantially the same as the voltage of the sampled analog signal.

4. The analog recording and playback system of claim 3 wherein prior to executing the plurality of program/read/compare cycles, the column driver programs the flash memory cell to an initial voltage to indicate a starting point of a programming range of the flash memory cell.

5. The analog recording and playback system of claim 3 wherein in the compare portion of each program/read/compare cycle a read current and a select gate voltage is used to read out the voltage of the flash memory cell.

6. The analog recording and playback system of claim 4 wherein the trim circuit to trim the initial voltage to maintain the programming range within a flash memory cell window due to process variations in the flash memory cell.

7. The analog recording and playback system of claim 5 wherein the trim circuit to trim the read current and the select gate voltage.

8. The analog recording and playback system of claim 1 wherein the trim circuit to trim both the programming current and the increasing step voltage.

9. The analog recording and playback system of claim 1 further comprising:
a first circuit to provide the analog signal; and
a second circuit coupled to the column driver to reconstruct the analog signal.

10. The analog recording and playback system of claim 9, further comprising:
an interface circuit coupled to the first circuit, the second circuit and the plurality of analog storage cells; and
a microcontroller coupled to the interface circuit for controlling the sampling and storage of the analog signal and the reading of the stored samples.

11. The analog recording and playback system of claim 10, wherein the microcontroller provides a clock signal for synchronizing data transfer into the first circuit and out of the second circuit.

12. The analog recording and playback system of claim 11, wherein the interface circuit comprises:
an input shift register for receiving control and address information from the microcontroller;
a logic circuit coupled to the input shift register for receiving the control information, the logic circuit generating an output signal in response to the control information;
an address circuit coupled to the input shift register and to the logic circuit receiving the address information from the input shift register in response to the output signal; and
an output shift register coupled to the logic circuit and to the address circuit, the address circuit providing the address information to the output shift register in response to the output signal.

13. The analog recording and playback system of claim 12, wherein the control information and address information include information for initiating reading of the stored samples at a specified address.

14. The analog recording and playback system of claim 9, wherein the second circuit comprises a peak detector coupled to the attenuator that determines if the read samples of the analog signal are below a predetermined threshold, the peak detector generating a signal if the read samples of the analog signal are below a predetermined threshold, wherein the attenuator attenuates the read samples of the analog signal in response to the signal.

15. The analog recording and playback system of claim 9, wherein in a high speed read mode, the second circuit reads the stored samples, compares each stored sample with a reference voltage, and shifts out the result of the comparisons at high speed.

16. A method of programming a sampled analog signal in a flash memory cell, comprising:
(a) programming the flash memory cell to a predetermined initial voltage;
(b) applying a predetermined programming current to the flash memory cell to increase a voltage of the flash memory cell by a predetermined step voltage;
(c) applying a predetermined read current and a predetermined select gate voltage to read out the voltage of the flash memory cell, the predetermined select gate voltage being trimmable to avoid read disturb conditions;
(d) comparing the voltage with the sampled analog signal; and
(e) inhibiting programming of the flash memory cell if the voltage and the sampled analog signal are substantially the same.

17. The method of claim 16 wherein prior to act (a), the method includes trimming the predetermined initial voltage to maintain a programming range within a flash memory cell window due to process variations.

18. The method of claim 16 wherein prior to act (b), the method includes trimming the predetermined programming current and the predetermined step voltage to maintain a programming range within a flash memory cell window due to process variations.

19. The method of claim 16 wherein prior to act (c), the method includes trimming the predetermined read current to minimize read error conditions.

20. The method of claim 16 wherein acts (b) through (d) are repeated until the voltage and the sampled analog signal are substantially the same.

21. A nonvolatile integrated circuit analog storage device having the capability of receiving, repetitively sampling, storing and reproducing an analog input signal, comprising:
an array having rows and columns of flash memory cells, the array including a pair of end of message ("EOM") cells for each scan in a row of flash memory cells, a pair of EOM cells to store a differential voltage for indicating that the corresponding scan is an end of a message;
a plurality of column drivers coupled to the columns of flash memory cells, each column driver to sample an analog signal, store the samples of the analog signal, and read out the stored samples of the analog signal to reconstruct the analog signal;
an interface circuit coupled to the array and plurality of column drivers; and
a microcontroller coupled to the interface circuit to control the sampling and storage of the analog signal and the reading of the stored samples, the microcontroller providing the addresses of the stored samples prior to reading of the stored samples, the microcontroller also providing addresses of the flash memory cells that are available for storage of samples of the analog signal.

22. The device of claim 21, wherein in a high speed read mode, the plurality of column drivers to read the stored samples, compare each stored sample with a reference voltage, and shift out the result of the comparisons at high speed.

23. The device of claim 21, wherein the microcontroller provides a clock signal for synchronizing data transfer.

24. The device of claim 21, wherein the interface circuit comprises:

an input shift register for receiving control and address information from the microcontroller;

a logic circuit coupled to the input shift register for receiving the control information, the logic circuit generating an output signal in response to the control information;

an address circuit coupled to the input shift register and to the logic circuit receiving the address information from the input shift register in response to the output signal; and an output shift register coupled to the logic circuit and to the address circuit, the address circuit providing the address information to the output shift register in response to the output signal.

25. The device of claim 23, wherein the control information and address information include information for initiating reading of the stored samples at a specified address.

26. The device of claim 23, wherein the control information and address information include information for initiating reading of the stored samples at a next available address.

* * * * *